(12) United States Patent
Elliott et al.

(10) Patent No.: US 7,258,520 B2
(45) Date of Patent: Aug. 21, 2007

(54) METHODS AND APPARATUS FOR USING SUBSTRATE CARRIER MOVEMENT TO ACTUATE SUBSTRATE CARRIER DOOR OPENING/CLOSING

(75) Inventors: Martin R. Elliott, Round Rock, TX (US); Michael Robert Rice, Pleasanton, CA (US); Robert B. Lowrance, Los Gatos, CA (US); Jeffrey C. Hudgens, San Francisco, CA (US); Eric Andrew Englhardt, Palo Alto, CA (US); Loy Randall Stuart, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 206 days.

(21) Appl. No.: 10/650,312

(22) Filed: Aug. 28, 2003

(65) Prior Publication Data

US 2004/0076496 A1 Apr. 22, 2004

Related U.S. Application Data

(60) Provisional application No. 60/407,339, filed on Aug. 31, 2002.

(51) Int. Cl.
*B65B 59/00* (2006.01)
*H01L 21/67* (2006.01)

(52) U.S. Cl. .................. 414/217; 414/411; 414/939

(58) Field of Classification Search ............ 414/217, 414/217.1, 411, 220, 805, 939; 206/832, 206/810, 307, 710
See application file for complete search history.

(56) References Cited

U.S. PATENT DOCUMENTS

| | | | | |
|---|---|---|---|---|
| 2,757,440 A | * | 8/1956 | Carman, Jr. | ............... 29/25.02 |
| 3,794,366 A | * | 2/1974 | Graham | ..................... 292/144 |
| 3,845,286 A | | 10/1974 | Aronstein et al. | |

(Continued)

FOREIGN PATENT DOCUMENTS

EP 0 277 536 A 8/1988

(Continued)

OTHER PUBLICATIONS

Weiss, Mitchell, "Evaluating 300-mm Fab Automation Technology Options and Selection Criteria", Jun. 1997, MICRO, vol. 15, No. 6, pp. 65-66, 68, 70, 72, 74, 76, 78-79.

(Continued)

*Primary Examiner*—Patrick Mackey
*Assistant Examiner*—Charles Greenhut
(74) *Attorney, Agent, or Firm*—Dugan & Dugan

(57) ABSTRACT

A system for opening a substrate carrier includes a substrate carrier having an openable portion. The substrate carrier also has an opening mechanism coupled to the openable portion. A substrate transfer location has a support adapted to support a substrate carrier. The substrate transfer location also has an actuator mechanism. The actuator mechanism is positioned relative to the support so as to interact with the opening mechanism of the substrate carrier. The actuator mechanism of the substrate transfer location and the opening mechanism of the substrate carrier are adapted to interface with each other at the substrate transfer location so as to employ movement of the substrate carrier to achieve opening and closing of the substrate carrier.

45 Claims, 22 Drawing Sheets

U.S. PATENT DOCUMENTS

| | | |
|---|---|---|
| 4,027,246 A | 5/1977 | Caccoma et al. |
| 4,166,527 A | 9/1979 | Beezer |
| 4,401,522 A | 8/1983 | Buschow et al. |
| 4,534,843 A | 8/1985 | Johnson et al. |
| 4,540,088 A | 9/1985 | Bergh |
| 4,650,264 A | 3/1987 | Dahnert |
| 4,694,957 A * | 9/1987 | Ackeret ............... 206/308.1 |
| 4,775,046 A | 10/1988 | Gramarossa et al. |
| 4,776,462 A * | 10/1988 | Kosugi et al. .............. 206/454 |
| 5,048,164 A | 9/1991 | Harima |
| 5,110,249 A | 5/1992 | Norman |
| 5,112,277 A * | 5/1992 | Cruz et al. ................. 454/195 |
| 5,256,204 A | 10/1993 | Wu |
| 5,261,935 A | 11/1993 | Ishii et al. |
| 5,265,721 A * | 11/1993 | Castritis ................ 206/308.1 |
| 5,360,106 A * | 11/1994 | Nakayama et al. ......... 206/309 |
| 5,372,471 A | 12/1994 | Wu |
| 5,377,476 A * | 1/1995 | Bohmer et al. ............... 53/255 |
| 5,382,127 A | 1/1995 | Garric et al. |
| 5,388,945 A * | 2/1995 | Garric et al. ............ 414/217.1 |
| 5,390,785 A * | 2/1995 | Garric et al. ............ 206/213.1 |
| 5,411,358 A | 5/1995 | Garric et al. |
| 5,495,939 A * | 3/1996 | Castritis .................... 206/307 |
| 5,549,205 A * | 8/1996 | Doche ........................ 206/710 |
| 5,603,777 A | 2/1997 | Ohashi |
| 5,612,886 A | 3/1997 | Weng |
| 5,743,409 A * | 4/1998 | Nakahara et al. ........... 206/710 |
| 5,762,544 A | 6/1998 | Zuniga et al. ............... 451/285 |
| 5,818,716 A | 10/1998 | Chin et al. |
| 5,827,118 A | 10/1998 | Johnson et al. |
| 5,829,939 A | 11/1998 | Iwai et al. |
| 5,884,392 A | 3/1999 | Lafond |
| 5,888,042 A | 3/1999 | Oda |
| 5,895,191 A * | 4/1999 | Bonora et al. .............. 414/217 |
| 5,976,199 A | 11/1999 | Wu et al. |
| 6,026,561 A | 2/2000 | Lafond |
| 6,036,426 A | 3/2000 | Hillman |
| 6,048,259 A | 4/2000 | Asai |
| 6,054,181 A | 4/2000 | Nanbu et al. |
| 6,068,439 A * | 5/2000 | Ohta .......................... 414/411 |
| 6,070,722 A | 6/2000 | Ng .......................... 206/308.1 |
| 6,082,948 A | 7/2000 | Fishkin et al. |
| 6,137,669 A * | 10/2000 | Chiang et al. .............. 361/103 |
| 6,183,186 B1 | 2/2001 | Peltola et al. |
| 6,235,634 B1 | 5/2001 | White et al. |
| 6,280,134 B1 | 8/2001 | Nering |
| 6,283,692 B1 | 9/2001 | Perlov et al. |
| 6,316,748 B1 * | 11/2001 | Ide .............................. 219/390 |
| 6,431,806 B1 * | 8/2002 | Doche ........................ 414/217 |
| 6,439,822 B1 | 8/2002 | Kimura et al. |
| 6,517,304 B1 * | 2/2003 | Matsumoto .................. 414/217 |
| 6,669,023 B2 * | 12/2003 | Kikuchi et al. .............. 206/759 |
| 6,719,516 B2 * | 4/2004 | Kroeker ...................... 414/217 |
| 2002/0090282 A1 * | 7/2002 | Bachrach .................... 414/271 |
| 2003/0010449 A1 * | 1/2003 | Gramarossa et al. ... 156/345.31 |
| 2004/0013499 A1 * | 1/2004 | Cho et al. ................... 414/217 |

FOREIGN PATENT DOCUMENTS

| | | |
|---|---|---|
| EP | 0365589 B1 | 9/1992 |
| EP | 0513651 A1 | 11/1992 |
| EP | 0 582 019 A1 | 2/1994 |
| EP | 0219826 B1 | 9/1994 |
| EP | 0472536 B1 | 12/1994 |
| EP | 0651429 A1 | 5/1995 |
| EP | 0663686 A1 | 7/1995 |
| EP | 0556193 B1 | 12/1995 |
| EP | 0663686 B1 | 6/1997 |
| EP | 0684631 B1 | 4/1998 |
| EP | 0555891 B1 | 1/1999 |
| EP | 0 987 750 A1 | 3/2000 |
| EP | 1 134 641 A1 | 9/2001 |
| JP | 08-046005 | 2/1996 |
| JP | 10-256346 | 9/1998 |
| JP | 11-121585 | 4/1999 |
| WO | WO 97/03001 A1 | 1/1997 |
| WO | WO 98/50946 A1 | 11/1998 |
| WO | WO 99/28952 A2 | 6/1999 |
| WO | WO99/64207 | 12/1999 |
| WO | WO 00/44653 A1 | 8/2000 |
| WO | WO 00/59004 A1 | 10/2000 |
| WO | WO 01/01828 A1 | 1/2001 |
| WO | WO 01/10756 A1 | 2/2001 |
| WO | WO 02/04774 A2 | 1/2002 |
| WO | WO 02/19392 A1 | 3/2002 |

OTHER PUBLICATIONS

Ebert, et al., "Efficient CFD Modeling of Single-Wafer Semiconductor Fabrication Systems for Closed-Loop Evaluation", Dec. 1997, Proceedings of the 36th IEEE Conference on Decision and Control, vol. 1, pp. 830-831.

Kobayashi, et al., "Particle Characteristics of 300-mm Minienvironment (FOUP and LPU)", 1999, Proceedings of 1999 IEEE International Symposium on Semiconductor Manufacturing Conference Proceedings, pp. 39-42.

No-Author, "PRI Selected By Varian Semiconductor to Supply 300mm Integrated Front-End Buffering Solutions", Feb. 10, 2000, Newswire, p. 7434.

* cited by examiner

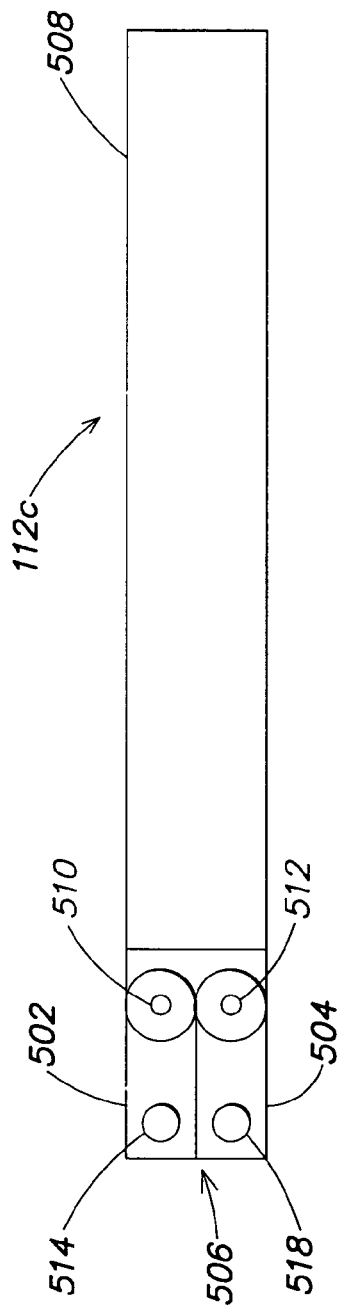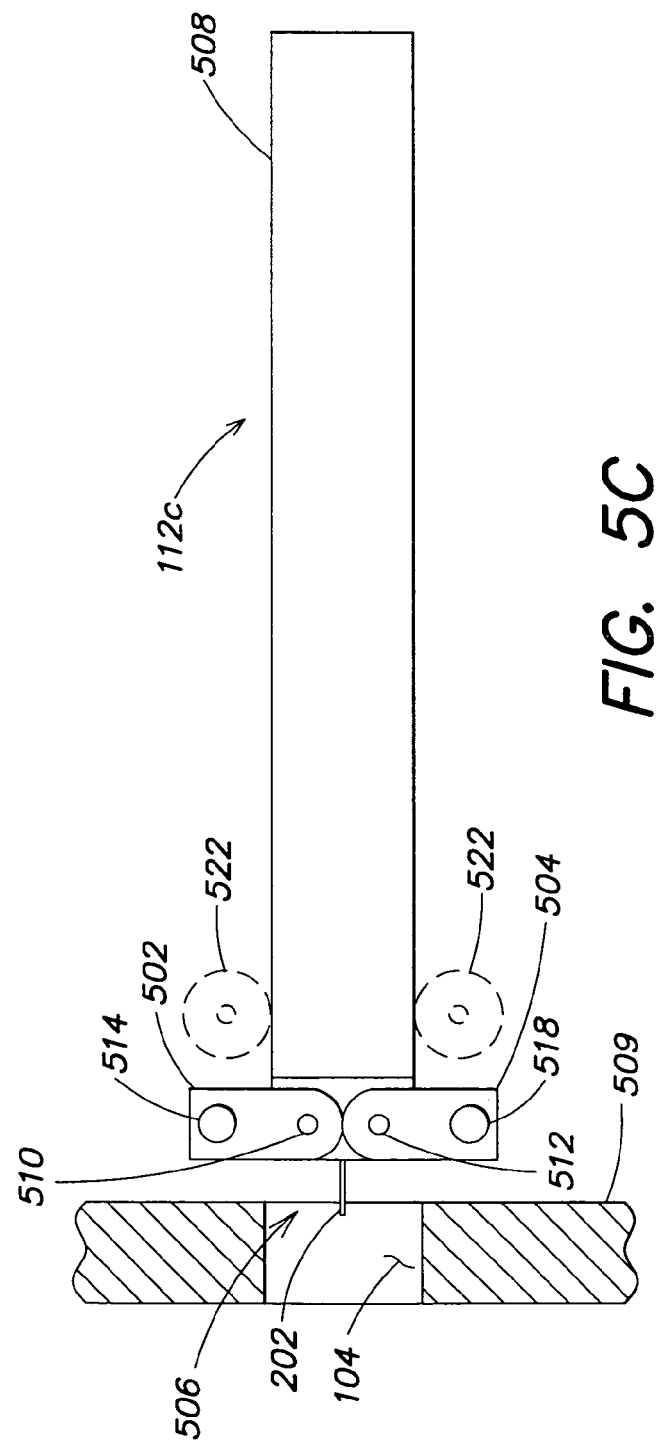

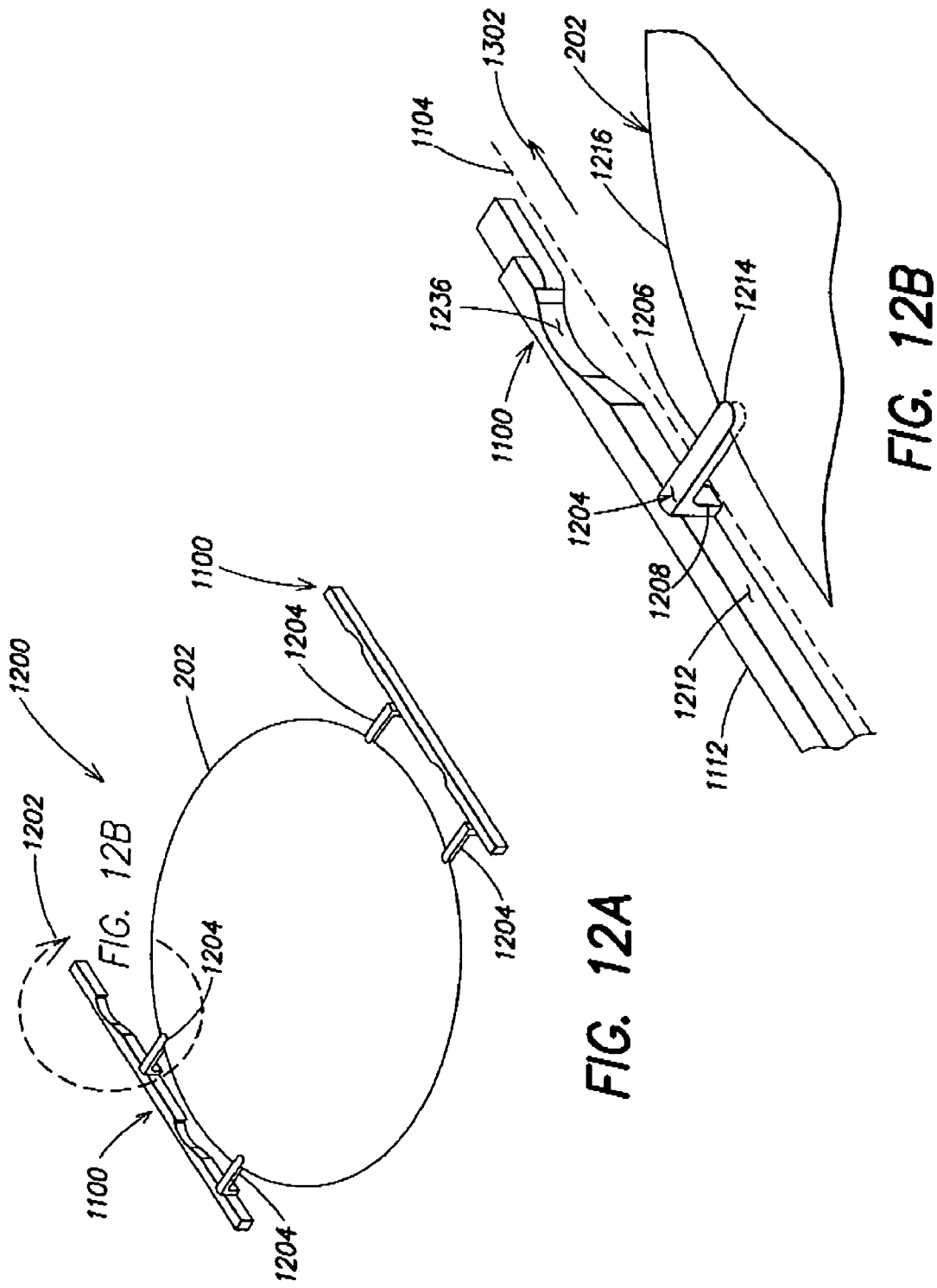

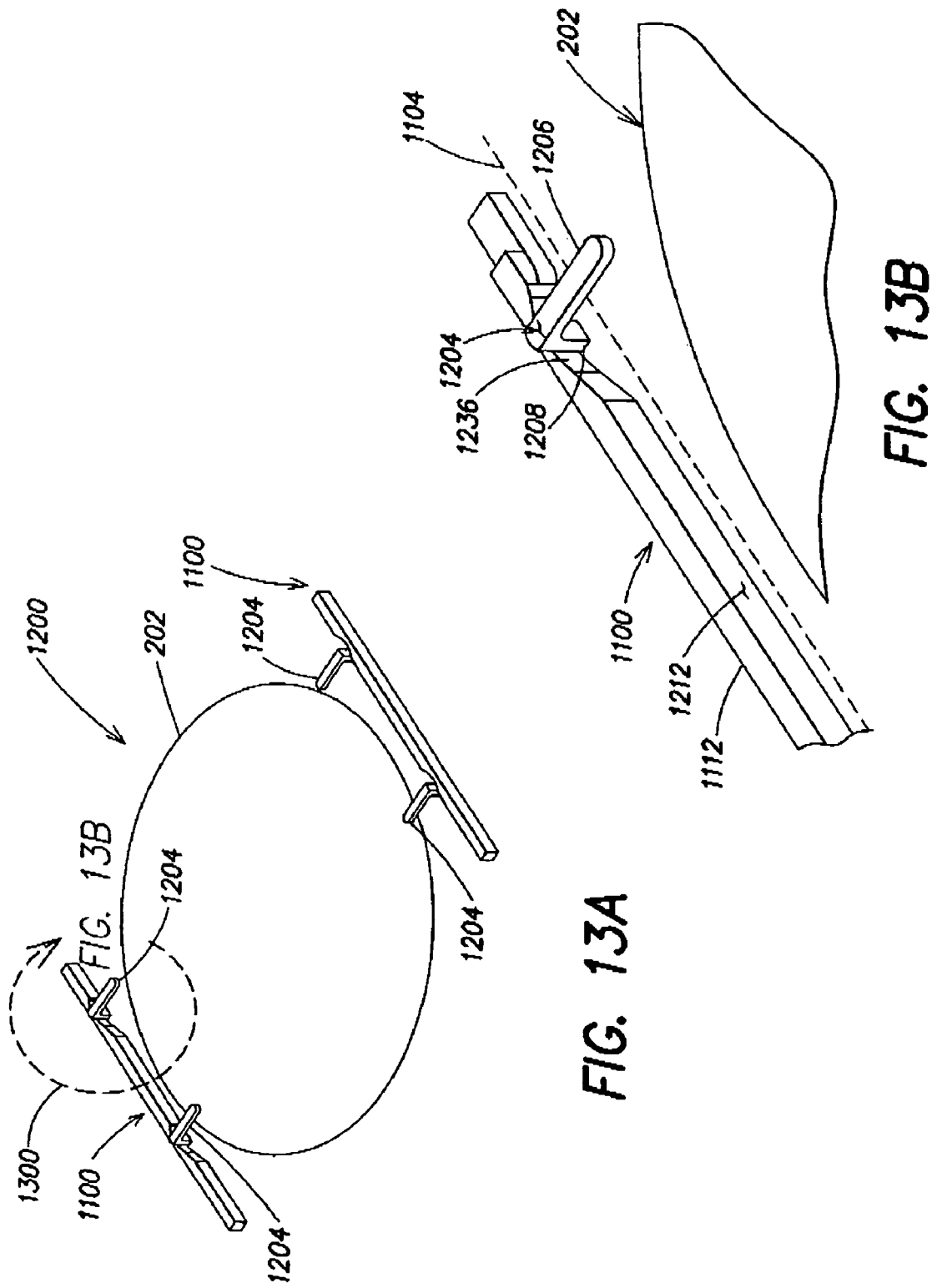

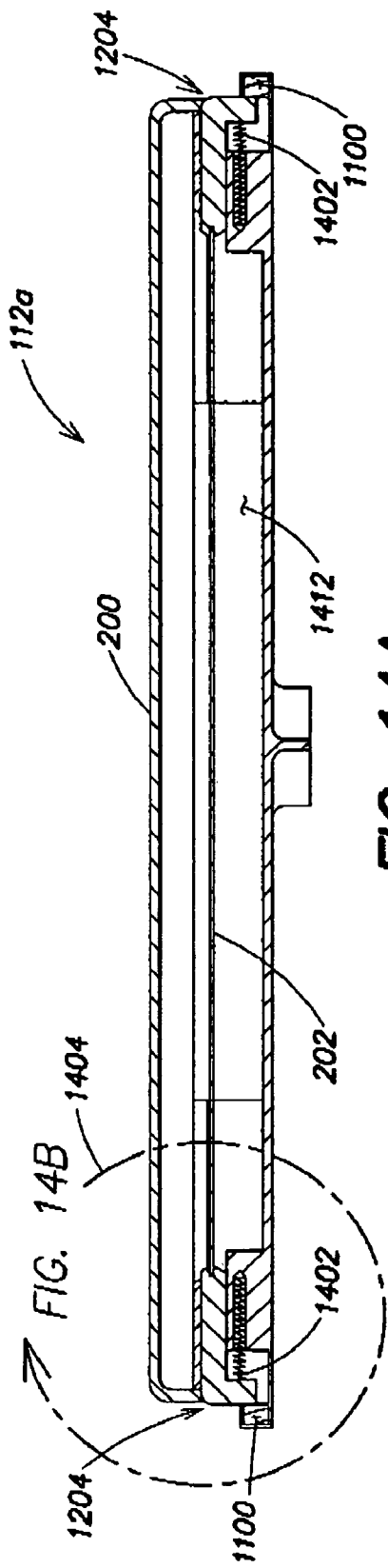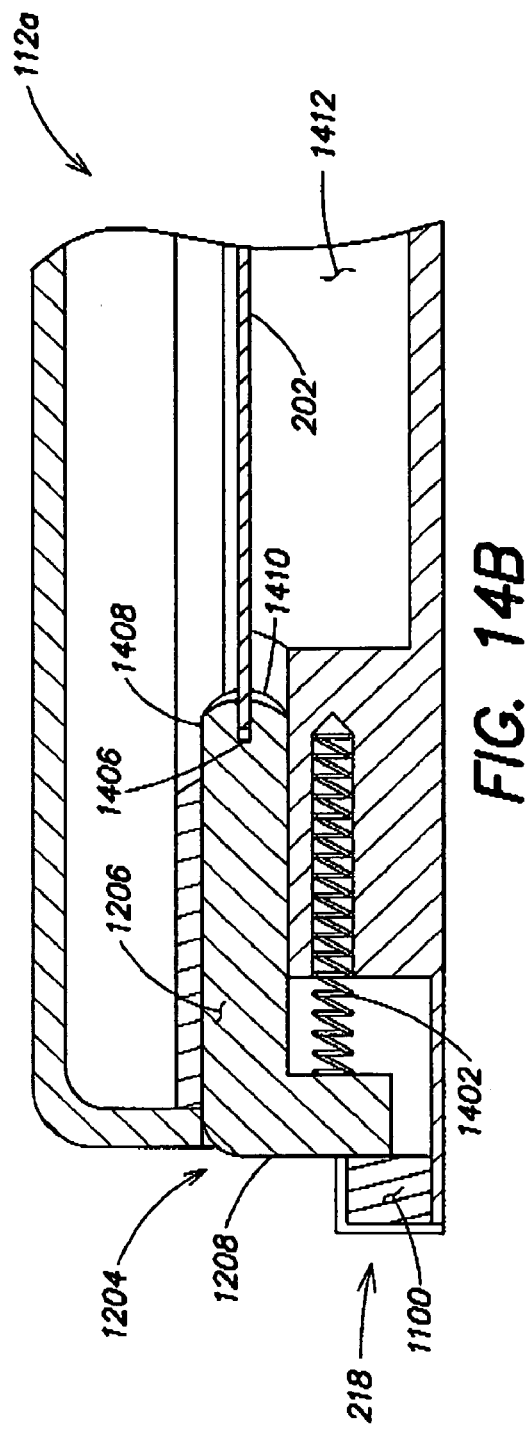

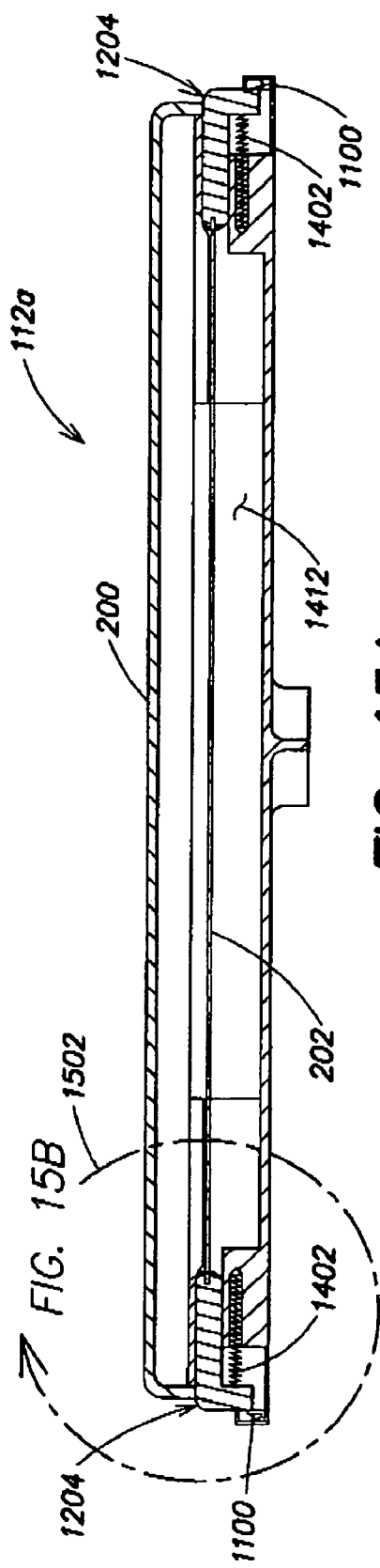
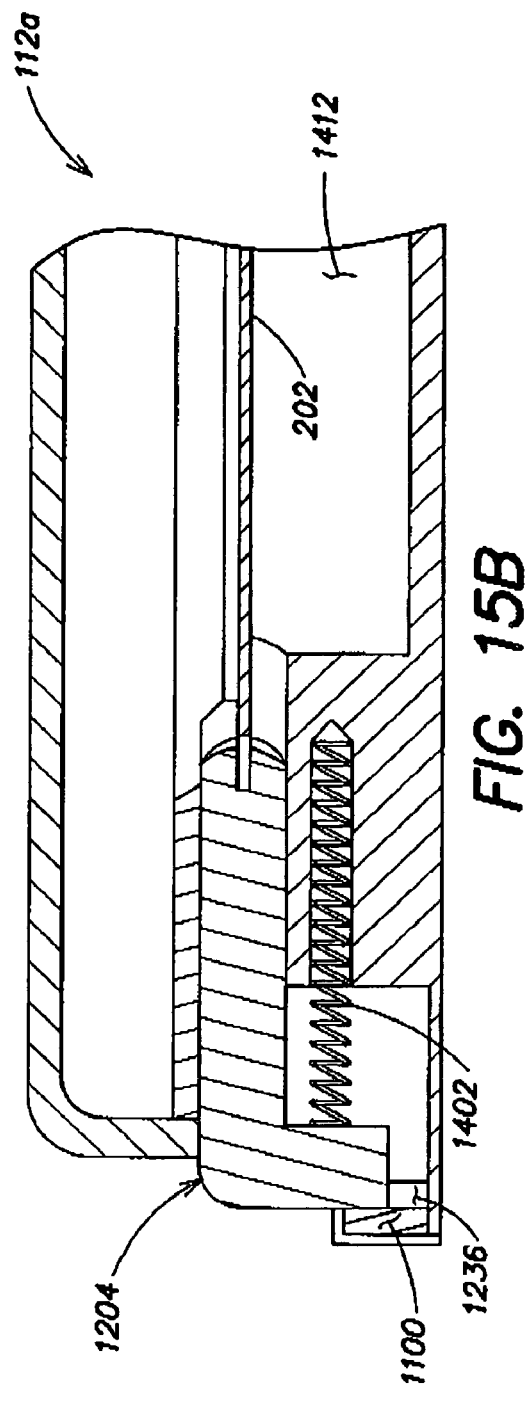
FIG. 15A
FIG. 15B

METHODS AND APPARATUS FOR USING SUBSTRATE CARRIER MOVEMENT TO ACTUATE SUBSTRATE CARRIER DOOR OPENING/CLOSING

This application claims priority from U.S. provisional application Ser. No. 60/407,339, filed Aug. 31, 2002, the content of which is hereby incorporated by reference herein in its entirety.

FIELD OF THE INVENTION

The present invention relates generally to substrate processing, and more particularly to apparatus and methods for interfacing a substrate carrier to a processing tool.

CROSS REFERENCE TO RELATED APPLICATIONS

The present application is related to the following commonly-assigned, co-pending U.S. Patent Applications, each of which is hereby incorporated by reference herein in its entirety:

U.S. Provisional Patent Application Ser. No. 60/407,451, filed Aug. 31, 2002 and titled "System For Transporting Wafer Carriers";

U.S. Provisional Patent Application Ser. No. 60/407,474, filed Aug. 31, 2002 and titled "Method and Apparatus for Unloading Wafer Carriers from Wafer Carrier Transport System";

U.S. Provisional Patent Application Ser. No. 60/407,336, filed Aug. 31, 2002 and titled "Method and Apparatus for Supplying Wafers to a Processing Tool";

U.S. Provisional Patent Application Ser. No. 60/407,452, filed Aug. 31, 2002 and titled "End Effector Having Mechanism For Reorienting A Wafer Carrier Between Vertical And Horizontal Orientations";

U.S. Provisional Patent Application Ser. No. 60/407,337, filed Aug. 31, 2002, and titled "Wafer Loading Station with Docking Grippers at Docking Stations";

U.S. Provisional Patent Application Ser. No. 60/407,340, filed Aug. 31, 2002 and titled "Wafer Carrier having Door Latching and Wafer Clamping Mechanisms";

U.S. Provisional Patent Application Ser. No. 60/443,087, filed Jan. 27, 2003 and titled "Methods and Apparatus for Transporting Wafer Carriers";

U.S. Provisional Patent Application Ser. No. 60/407,463, filed Aug. 31, 2002 and titled "Wafer Carrier Handler That Unloads Water Carriers Directly From a Moving Conveyor"

U.S. Provisional Patent Application Ser. No. 60/443,004, filed Jan. 27, 2003 and titled "Wafer Carrier Handler That Unloads Water Carriers Directly From a Moving Conveyor"

U.S. Provisional Patent Application Ser. No. 60/443,153, filed Jan. 27, 2003 and titled "Overhead Transfer Flange and Support for Suspending Wafer Carrier";

U.S. Provisional Patent Application Ser. No. 60/443,001, filed Jan. 27, 2003 and titled "Systems and Methods for Transferring Wafer Carriers Between Processing Tools"; and U.S. Provisional Patent Application Ser. No. 60/443,115, filed Jan. 27, 2003 and titled "Apparatus and Method for Storing and Loading Wafer Carriers".

BACKGROUND

Semiconductor devices are made on substrates, such as silicon substrates, glass plates or the like, often termed wafers, for use in computers, monitors, etc. These devices are made by a sequence of fabrication steps, such as thin film deposition, oxidation, etching, polishing and thermal and lithographic processing. Although in many cases multiple fabrication steps may be performed in a single processing apparatus, substrates typically must be transported between different processing tools for at least some of the fabrication steps required for device fabrication.

Substrates generally are stored in carriers for transfer between processing tools and other locations. In many cases substrate carriers completely enclose the substrate or substrates contained therein in a stationary volume of air or gas, to reduce the risk of particulate contamination of the substrates. Accordingly, when the substrate carrier is interfaced to a processing tool, it is necessary to open and/or remove a door of the substrate carrier to permit the substrates to be extracted from the substrate carrier. While existing techniques and arrangements for removing doors from substrate carriers are generally satisfactory, it would be desirable to simplify such techniques and arrangements so as to reduce the cost and complexity thereof.

SUMMARY OF THE INVENTION

According to a first aspect of the invention, an apparatus for opening a substrate carrier is provided. The inventive apparatus includes a substrate transfer location having a support adapted to support a substrate carrier, and an actuator mechanism positioned relative to the support so as to interact with an opening mechanism of a substrate carrier supported by the support. The inventive apparatus further provides that the actuator mechanism is adapted to interface with the opening mechanism of the substrate carrier so as to employ a movement of the substrate carrier to actuate opening of the substrate carrier at the substrate transfer location.

According to a second aspect of the invention, a substrate carrier is provided, including a substrate carrier housing having an openable portion and an opening mechanism coupled to the openable portion adapted so as to interface with an actuator mechanism located at a substrate transfer location so as to employ movement of the substrate carrier to actuate opening and closing of the substrate carrier.

According to a third aspect of the invention, a system for opening a substrate carrier is provided. The inventive system includes a substrate carrier having an openable portion, and having an opening mechanism coupled to the openable portion. The inventive system further includes a substrate transfer location having a support adapted to support the substrate carrier, and an actuating mechanism positioned relative to the support so as to interact with the opening mechanism coupled to the openable portion of the substrate carrier. The inventive system further provides that the actuating mechanism of the substrate transfer location and the opening mechanism of the substrate carrier are adapted to interface with each other at the substrate transfer location, so as to employ movement of the substrate carrier to achieve opening and closing of the substrate carrier.

According to a fourth aspect of the invention, a system for opening a substrate carrier includes a port adapted to have a substrate transferred therethrough, a first mechanism adapted to move a substrate carrier toward the port, and a second mechanism adapted to translate motion of the substrate carrier toward the port into a force for opening a door of the substrate carrier.

According to a fifth aspect of the invention, a method of opening a substrate carrier includes moving a substrate carrier toward a port that is adapted to have a substrate transferred therethrough, and translating motion of the substrate carrier toward the port into a force for opening a door of the substrate carrier.

According to a sixth aspect of the invention, a method of opening a substrate carrier includes moving a substrate carrier, and translating the motion of the substrate carrier into respective forces for opening two doors of the substrate carrier.

The apparatus and methods of the present invention provide for a highly efficient, reliable and cost-effective arrangement for opening a substrate carrier that is being interfaced to a processing tool.

Further features and advantages of the present invention will become more fully apparent from the following detailed description of exemplary embodiments, the appended claims and the accompanying drawings.

BRIEF DESCRIPTION OF THE DRAWINGS

FIG. 5B is a side elevational view of the inventive substrate carrier of FIG. 5A, showing the substrate carrier in a closed condition;

FIG. 5C is a side elevational view similar to FIG. 5B, showing the substrate carrier according to this embodiment of the invention in an open condition;

FIG. 12A is a schematic isometric view of an exemplary substrate clamping mechanism that may interact with the latching mechanism of FIG. 11;

FIG. 12B is a magnified isometric view, showing details of a portion of FIG. 12A;

FIGS. 13A and 13B are views that are respectively similar to FIGS. 12A and 12B, but showing the substrate clamping mechanism of FIGS. 12A and 12B in a released (non-clamping) condition;

FIG. 14A is a cross sectional view of the substrate carrier of FIG. 1 wherein an alternative clamping member configuration is employed;

FIG. 14B is a magnified isometric view showing details of a portion of FIG. 14A;

FIG. 15A is a cross sectional view similar to FIG. 14A, but with the clamping members retracted; and FIG. 15B is a magnified isometric view showing details of a portion of FIG. 15A.

DETAILED DESCRIPTION

In accordance with an exemplary aspect of the present invention, movement of a substrate carrier toward a port of a substrate transfer location causes structure associated with a door of the substrate carrier to interact with structure associated with the substrate transfer location to cause the door of the substrate carrier to open. Movement of the substrate carrier away from the port of the substrate transfer location causes the door of the substrate carrier to close.

Figure 1:
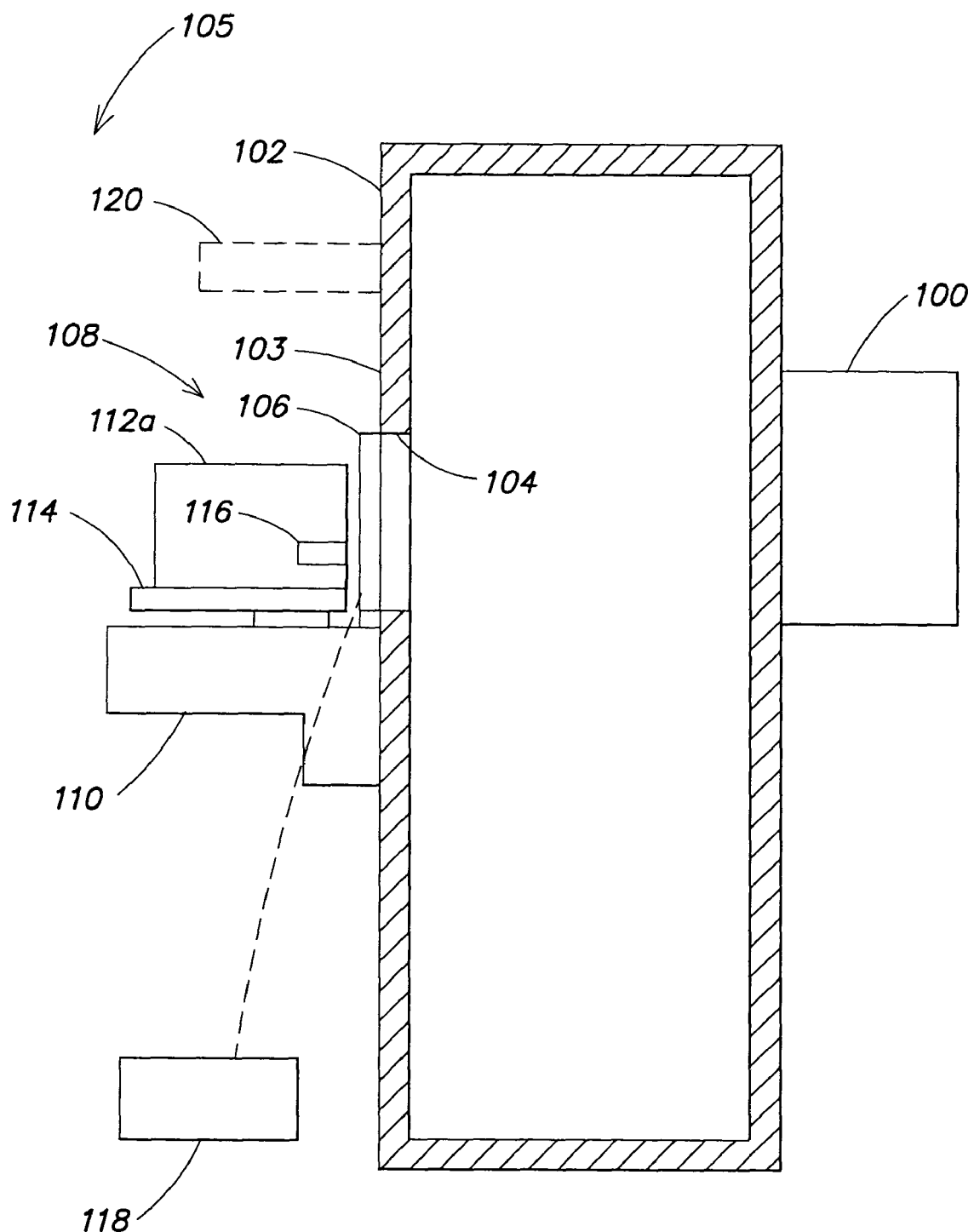
FIG. 1 is a schematic side elevational view showing a substrate carrier opening apparatus provided in accordance with the invention and adapted to use substrate carrier movement to actuate substrate carrier opening and closing.

FIG. 1 is a schematic side elevational view which shows a processing tool and an associated factory interface that includes a substrate carrier opening apparatus provided in accordance with the invention.

In FIG. 1, reference numeral 100 indicates a schematic representation of a processing tool. As is familiar to those who are skilled in the art, the processing tool 100 may be configured for atmospheric processing or vacuum processing, and in addition to one or more processing chambers, may include one or more load locks, and/or one or more transfer chambers. None of these features are separately shown. It will be appreciated that, in the processing chambers, one or more semiconductor fabrication processes (e.g., etching, deposition, cleaning, polishing or metrology) may be applied to substrates that are loaded into the processing tool 100.

In the example of FIG. 1, a factory interface (FI) 102 is coupled to the processing tool 100 to provide an interface between the processing tool 100 and one or more substrate carriers that contain substrates to be loaded into the processing tool 100. The factory interface 102 includes a clean room wall 103 which separates the interior of the factory interface 102 from a clean room environment 105. The factory interface 102 includes a port 104 through which one or more substrates may be transferred into the factory interface 102. More than one port 104 may be employed. An optional door 106 may selectively close the port 104 of the factory interface 102. Alternately, the port may remain open provided the pressure within the factory interface 102 is higher than the pressure external thereto (e.g., so as to prevent contaminants from entering the factory interface 102).

A substrate transfer location 108 is provided in accordance with the invention at an outer side of the port 104. The substrate transfer location 108 includes a support 110, on which an inventive substrate carrier 112a may be supported. Associated with the support 110 is a carrier moving mechanism 114, such as a motorized stage, pneumatic cylinder or the like, which is adapted to move the substrate carrier 112a toward and away from the port 104 of the factory interface 102. It will be understood that alternatively a substrate carrier may be supported via a gripper (not shown) that grips the substrate carrier, for example, via an overhead transfer flange (not shown) of the substrate carrier to thereby suspend the substrate carrier. Either the gripper or the support 110 may include one or more kinematic features (e.g., pins, mounts, etc.) to aid in substrate carrier positioning.

In FIG. 1, reference numeral 116 schematically represents a door or openable portion of the substrate carrier 112a. Not separately shown in FIG. 1 are an actuator mechanism (described below) included in the substrate transfer location 108, and an opening mechanism (described below) provided on the substrate carrier 112a. In accordance with the invention, the actuator mechanism and the opening mechanism cooperate to open the openable portion 116 of the substrate carrier 112a. The factory interface 102 may also include a substrate handling robot, which is not shown, and which is adapted to transfer substrates between the substrate carrier 112a and the processing tool 100.

A controller 118 is coupled to the door 106 of the factory interface 102 and to the carrier moving mechanism 114 to control operation thereof.

Reference numeral 120 represents one or more substrate carrier storage shelves that may be mounted in association with the substrate transfer location 108. For example, the one or more substrate carrier storage shelves 120 may be located vertically above the substrate transfer location 108.

Figure 2A:
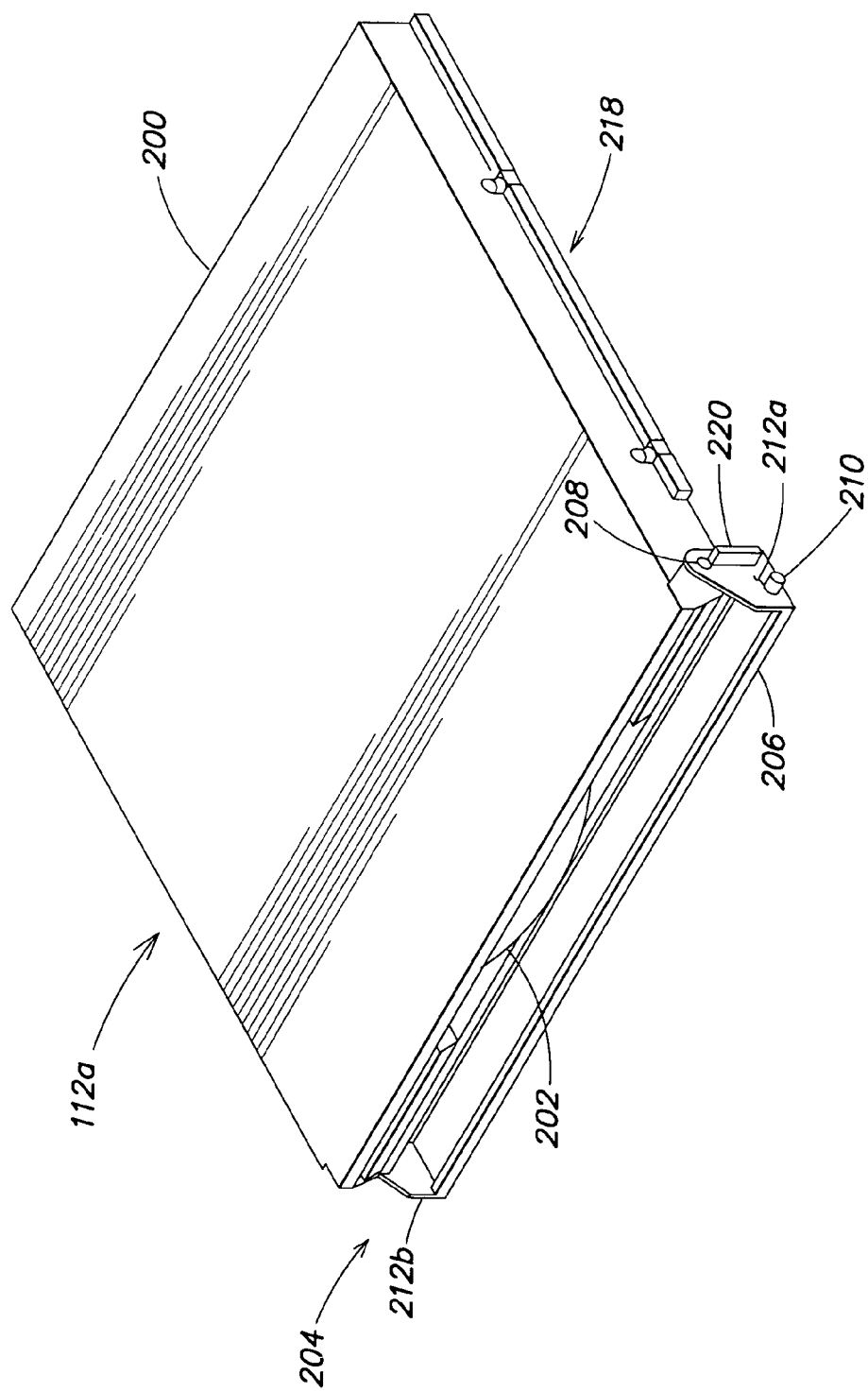
FIG. 2A is an isometric view of a substrate carrier provided in accordance with the present invention.

FIG. 2A is an isometric view of the substrate carrier 112a provided in accordance with a first embodiment of the invention. The inventive substrate carrier 112a includes a carrier housing 200, in which a substrate 202 may be contained. The carrier housing 200 includes an openable portion 204 including a door 206. The door 206 is pivotably mounted to the carrier housing 200 by means of hinges 208 of which only one is visible in FIG. 2A. The door 206 is arranged to pivot downwardly from a closed position (FIG. 2C) to an open position (shown in FIGS. 2A and 2B) and upwardly from the open position to the closed position (FIG. 2C).

Continuing to refer to FIG. 2A, a cam follower 210, which may be a stationary pin or a roller, extends outwardly from a side 212a of the door 206, and functions as an opening mechanism for the door 206. (Although only one cam follower is shown in the drawing, another cam follower may extend outwardly from the other side 212b of the door 206.)

Figure 2B:
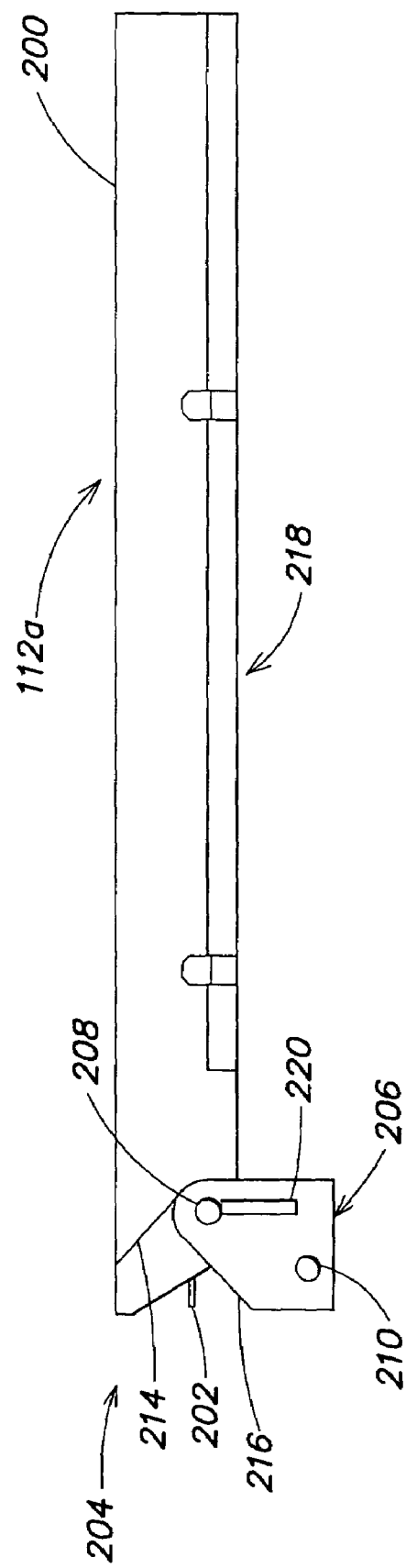
FIG. 2B is a side elevational view showing the substrate carrier of FIG. 2A in an open condition.
Figure 2C:
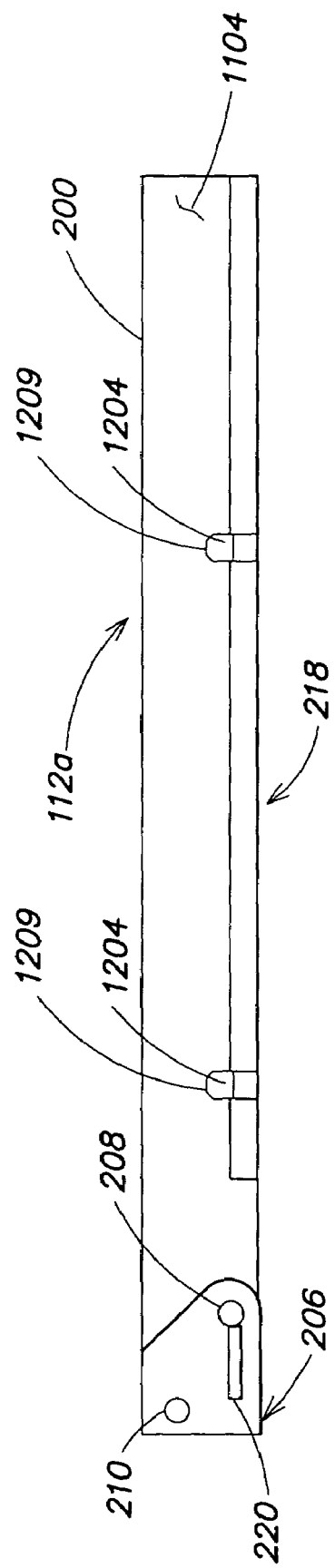
FIG. 2C is a side elevational view of the substrate carrier of FIG. 2A in a closed condition.

FIG. 2B is a side elevational view of the substrate carrier 112a in an open condition. As seen from FIG. 2B, the openable portion 204 of the carrier housing 200 may have an angled face, as indicated at 214 (e.g., 45°) and the door 206 may have a complimentary angled face, as indicated at 216, so that when the door 206 closes, it does so without scrubbing action relative to the openable portion 204 of the carrier housing 200. Consequently, the likelihood of generating particles upon closing of the door 206 may be reduced. One or both of the angled faces 214, 216 may be covered with an elastomeric material, such as silicone, to affect sealing therebetween.

Referring again to FIG. 2A, reference numeral 218 indicates a latching mechanism which cooperates with a tab 220 on the side 212a of the door 206 to latch the door 206, in a manner described below with reference to FIG. 11, when the door 206 is in a closed condition.

Figure 3A:
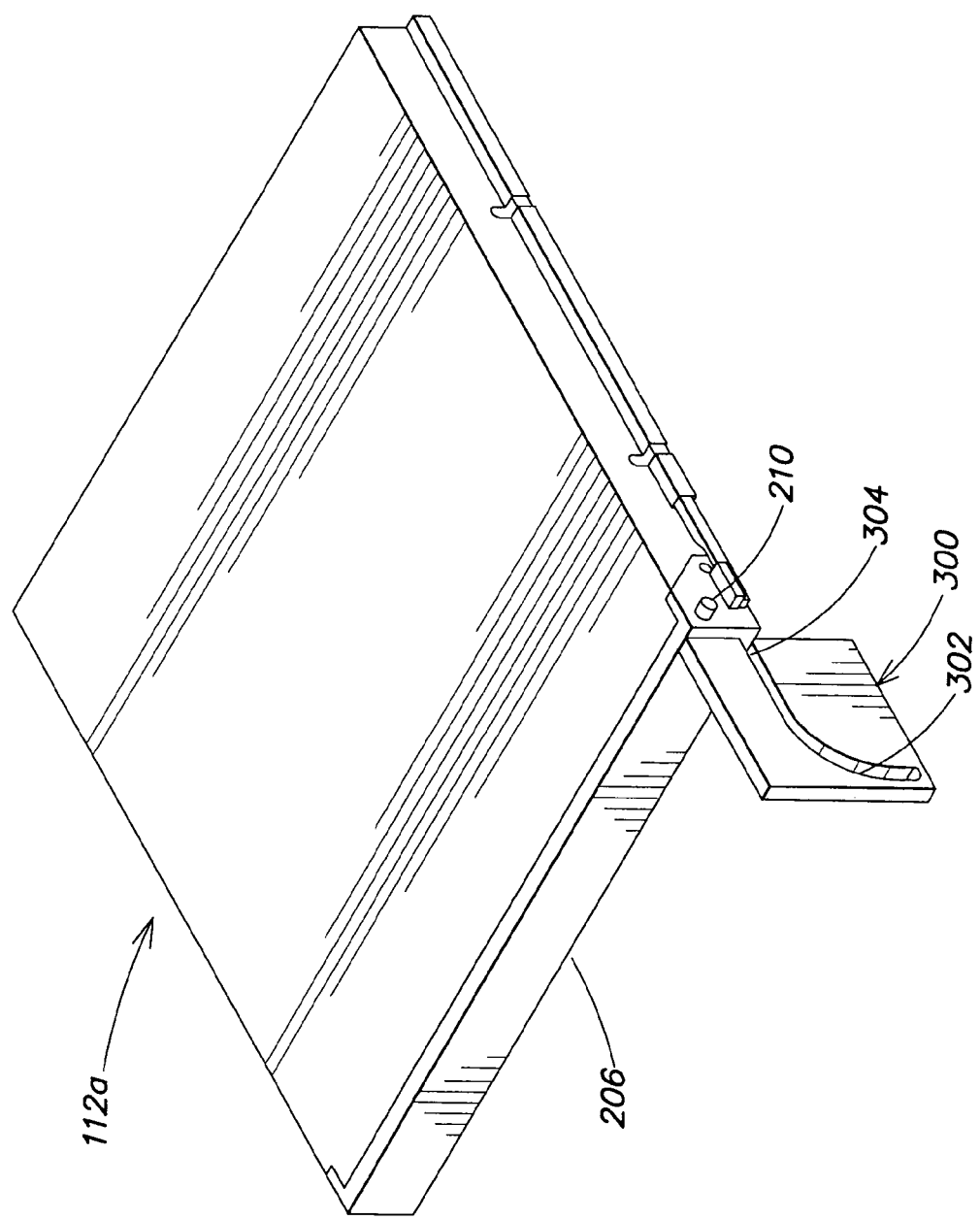
FIG. 3A is an isometric view showing the inventive substrate carrier of FIG. 2A confronting a carrier opening apparatus provided in accordance with the invention.

FIG. 3A is an isometric view showing the inventive substrate carrier 112a in juxtaposition with a cam 300 which functions as an actuator mechanism for opening and closing the door 206. It will be appreciated that FIG. 3A is a schematic view, and that, in practice, the cam 300 may be mounted in association with the port 104 of the factory interface 102 (FIG. 1).

Continuing to refer to FIG. 3A, the cam 300 has a curved cam slot 302 which is adapted to interact with the cam follower 210 on the door 206 of the substrate carrier 112a such that the door 206 is opened as the substrate carrier 112a is moved in the forward direction (i.e., in the direction toward and generally perpendicular to the port 104, the factory interface 102 and the processing tool 100) by the carrier moving mechanism 114 (FIG. 1).

Figure 3B:
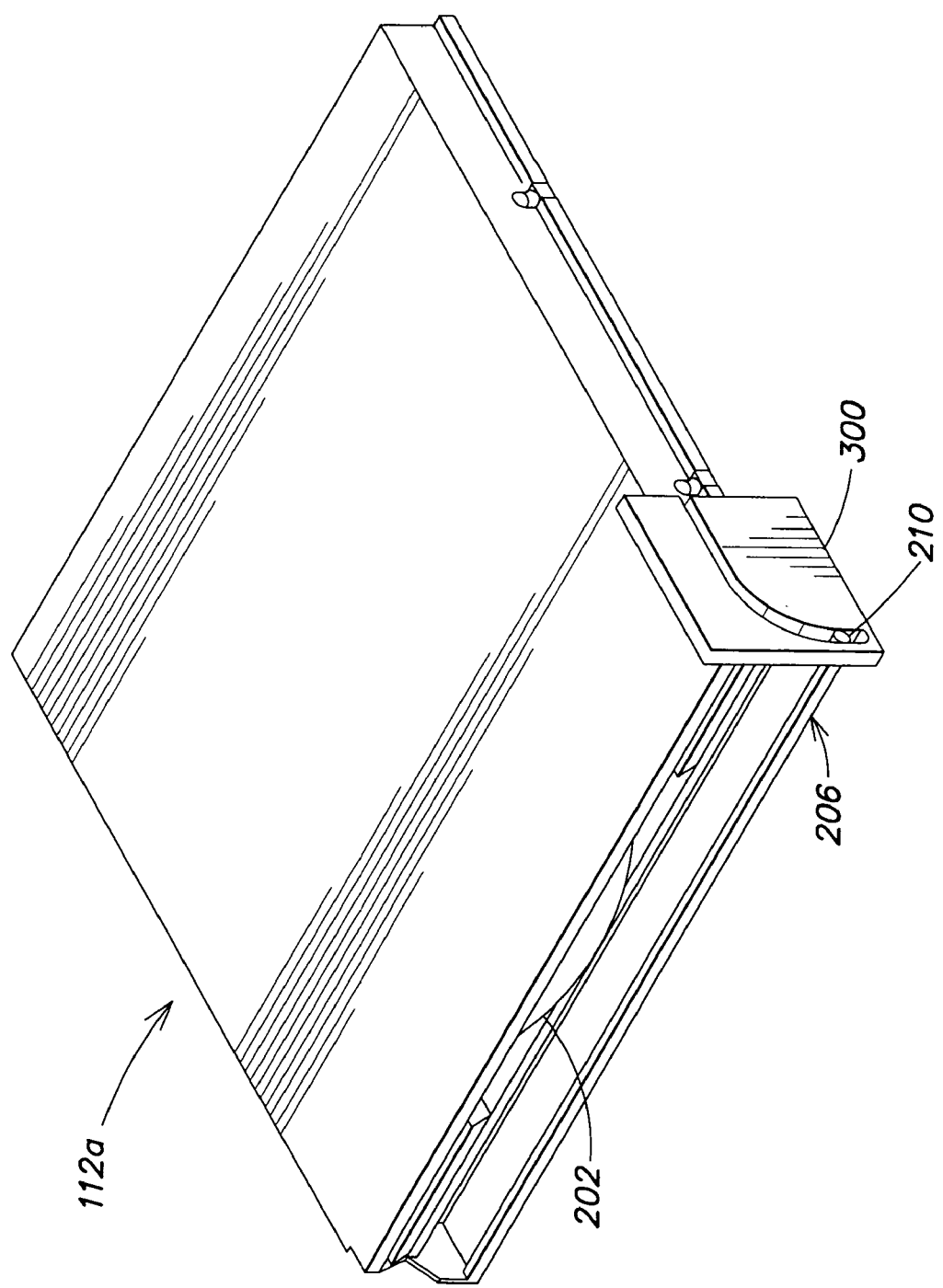
FIG. 3B is an isometric view showing the inventive substrate carrier and the inventive carrier opening apparatus with the substrate carrier in an open condition.

In particular, the cam follower 210 of the door 206 of the substrate carrier 112a enters the cam slot 302 of the cam 300 at a mouth 304 of the cam slot 302, and then is guided forward and downwardly in the cam slot 302 to open the door 206 of the substrate carrier 112a. FIG. 3B is an isometric view showing the substrate carrier 112a with its door 206 opened as a result of the interaction between the cam 300 and the cam follower 210. It will be recognized that the substrate 202 contained in the carrier housing 200 of the substrate carrier 112a is now accessible to be extracted from the substrate carrier 112a by the substrate handler robot (not shown) of the factory interface 102.

It will be further recognized that the cam 300 and the cam follower 210 cooperate to translate forward motion of the substrate carrier 112a into a force for opening the door 206.

If a second cam follower is provided extending outwardly from the other side of the door 206 (side 212b in FIG. 2A), then a second cam may be provided to interact with the second cam follower.

Figure 4:
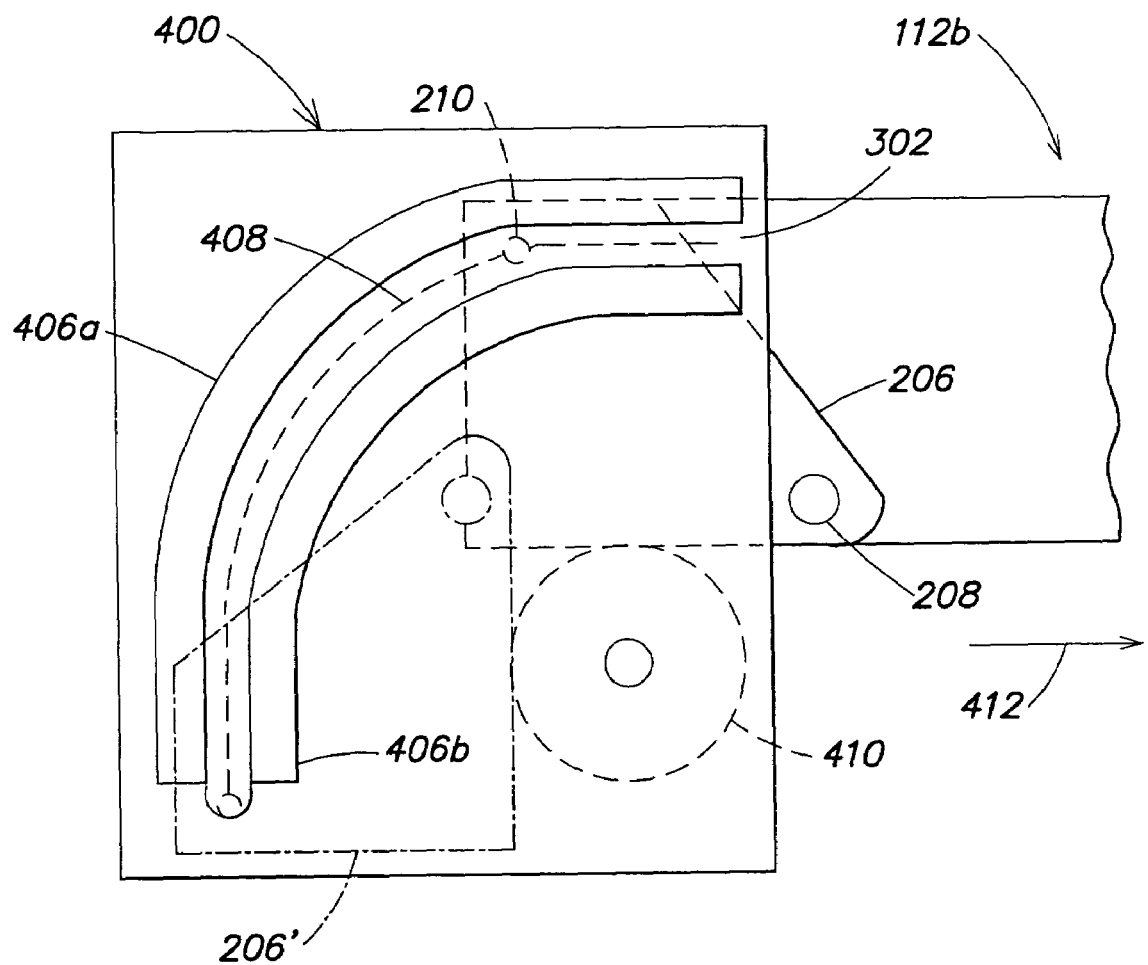
FIG. 4 is a schematic view of an alternate embodiment of the substrate carrier of FIGS. 2A–B wherein a magnetic cam follower is employed.

FIG. 4 illustrates an alternate embodiment of the of the substrate carrier 112a of FIGS. 2A–2B (referred to as substrate carrier 112b in FIG. 4) and of the cam 300 (referred to as cam 400 in FIG. 4) wherein magnetic coupling is employed. Specifically, in the embodiment of FIG. 4, the cam follower 210 is configured to have a first magnetic polarity facing the cam 400; and the cam slot 302 is defined between first and second magnets 406a, 406b. The first and second magnets 406a, 406b may be configured to have the same or the opposite magnetic polarity as that of the cam follower 210 (e.g., in a direction facing the cam follower 210). For example, the cam follower 210 may have a north or a south magnetic polarity facing the cam 400 and the first and second magnets 406a, 406b may both have a north or a south magnetic polarity facing the cam follower 210. Like polarities will repel and opposite polarities will attract. In at least one embodiment of the invention, the cam follower 210 travels along a path 408 defined between the magnets 406a, 406b without contacting the magnets 406a, 406b or any other part of the cam 400. Particle generation thereby may be reduced. Such a "non-contact" path 408 may be achieved whether the cam follower 210 is directed via repulsive or attractive forces from the magnets 406a, 406b. The latching mechanism 218 may be employed to maintain the door 206 closed when the substrate carrier 112b is being transported.

Likewise, a magnet (not shown) having an opposite polarity to that of the cam follower 210 and positioned on the substrate carrier 112b may be similarly employed to maintain the door 206 in a closed position during transport.

As further shown in FIG. 4, a roller 410 may be employed to assist in guiding the door 206 closed when the substrate carrier 112b is retracted (undocked) from the port 104 (FIG. 1) by moving the substrate carrier 112b away from the cam 400 (in direction 412 in FIG. 4). As the substrate carrier 112b is retracted from its fully docked position (as indicated by dashed line 206' in FIG. 4), the door 206 rolls along the roller 410, and the roller 410 exerts an upward force on the door 206. The door 206 thereby may be easily guided along the cam slot 302 as the door 206 pivots shut. The roller 410 may form part of the cam 400, or may be otherwise mounted in or in front of the port 104 (FIG. 1). The roller 410 may be employed with any type of cam slot (e.g., whether or not a magnetic cam follower is employed) and with any of the inventive substrate carriers described herein. The roller 410 may comprise one or more wheels or rotateable cylinders, and may be employed to support a substrate carrier during docking/undocking.

Another embodiment of the invention will now be described with reference to FIGS. 5A–6B.

Figure 5A:
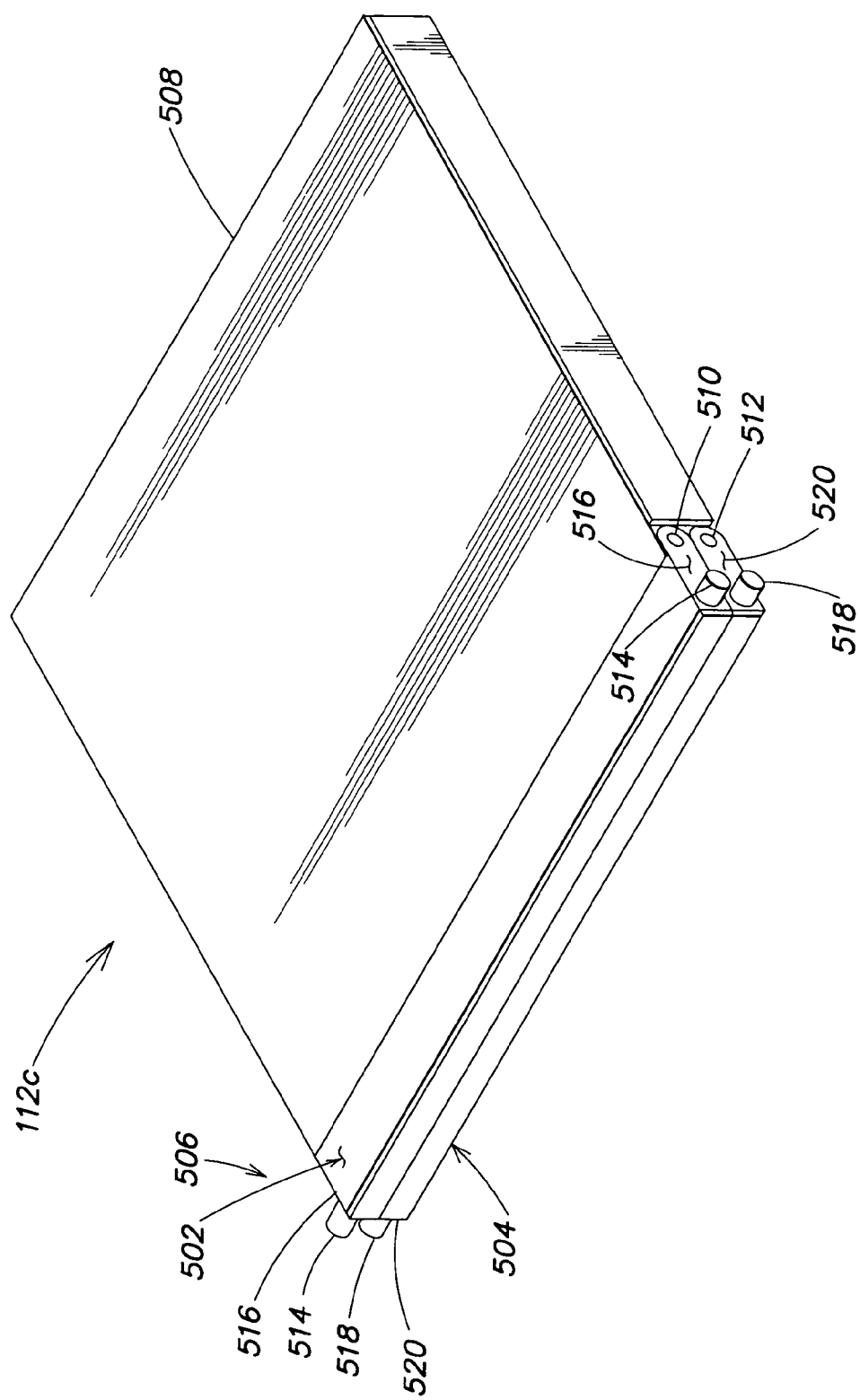
FIG. 5A is an isometric view of a substrate carrier provided in accordance with still another embodiment of the invention.
Figure 5D:
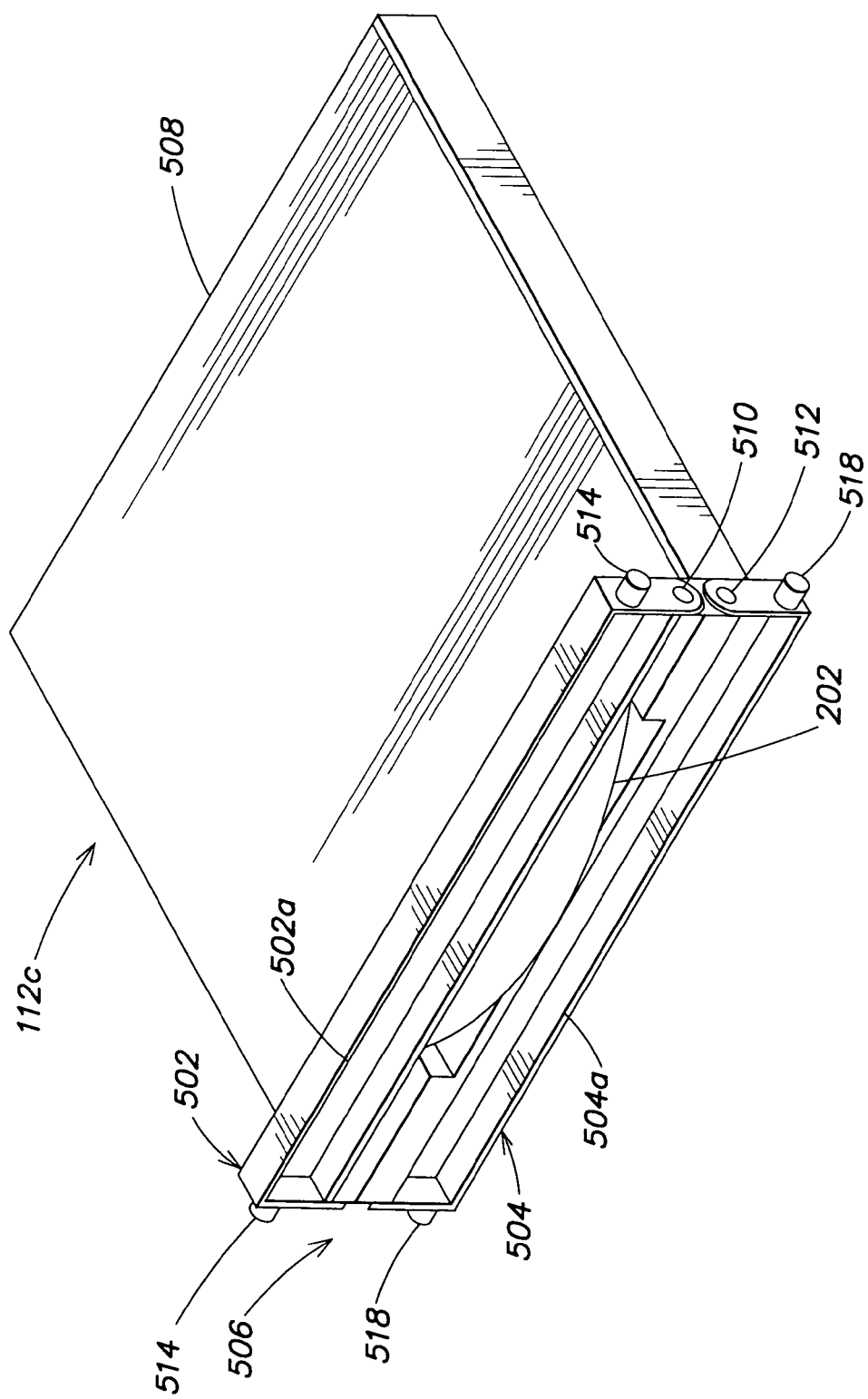
FIG. 5D is an isometric view showing the substrate carrier of FIGS. 5A–5C in an open condition.

FIGS. 5A and 5B are respectively an isometric view and a side elevational view showing a substrate carrier 112c (provided in accordance with this embodiment of the invention) in a closed condition. FIGS. 5C and 5D are respectively a side elevational view and an isometric view showing the substrate carrier 112c in an open condition.

The substrate carrier 112c has an upper door 502 and a lower door 504 which together are adapted to selectively close an openable portion 506 of a carrier housing 508 of the substrate carrier 112c. For example, a first face 502a (FIG. 5D) of the upper door 502 may contact a second face 504a of the lower door 504 to close the openable portion 506 of the housing 508. One or both of the faces 502a, 502b may be covered with an elastomeric material, such as silicone, to affect sealing therebetween. In at least one embodiment of the invention, the first and second faces 502a, 504a also may seal to a portion of the factory interface 102 that surrounds the port 104 (e.g., a loadport plate 509 in FIG. 5C) when the doors 502, 504 are open and the substrate carrier 112c is docked to the port 104 as described further below. The seal may be airtight, or merely provide a controlled gap between the doors 502, 504 and the factory interface 102.

The upper door 502 is pivotably mounted to the carrier housing 508 by means of hinges 510, of which only one is visible in the drawings. The lower door 504 is pivotably mounted to the carrier housing 508 by means of hinges 512, of which only one is visible in the drawings. Cam followers 514 (which may be rollers or fixed pins) extend outwardly from the sides 516 of the upper door 502. Cam followers 518 (which also may be rollers or fixed pins) extend outwardly from the sides 520 of the lower door 504. A plurality of rollers 522 (shown in phantom) may be employed to assist in closing of the doors 502, 504 as previously described with regard to the single door embodiments of the inventive substrate carrier.

Figure 6A:
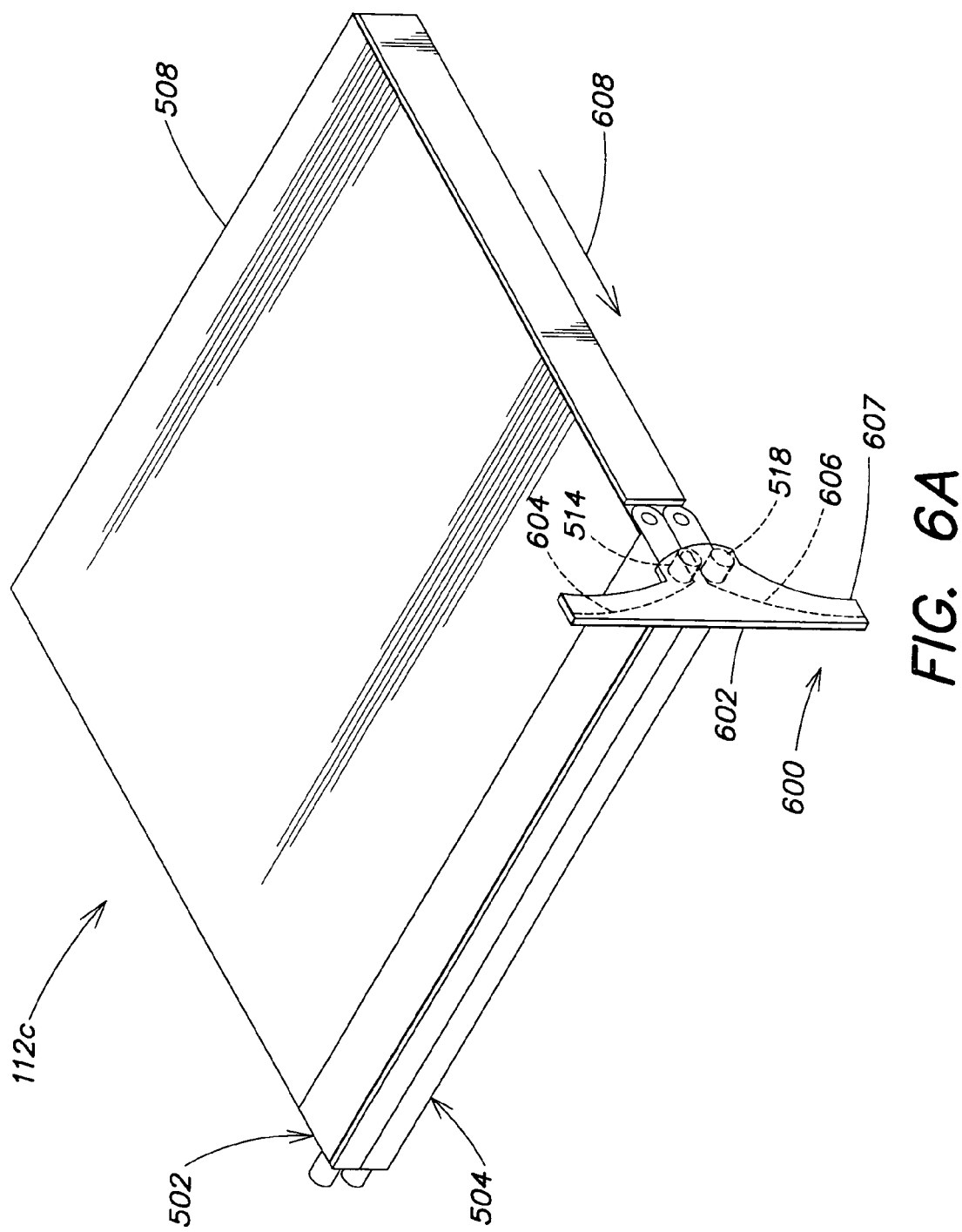
FIG. 6A is an isometric view showing the substrate carrier of FIGS. 5A–5D confronting a carrier opening apparatus provided in accordance with the invention to operate with the substrate carrier of FIGS. 5A–5D.
Figure 6B:
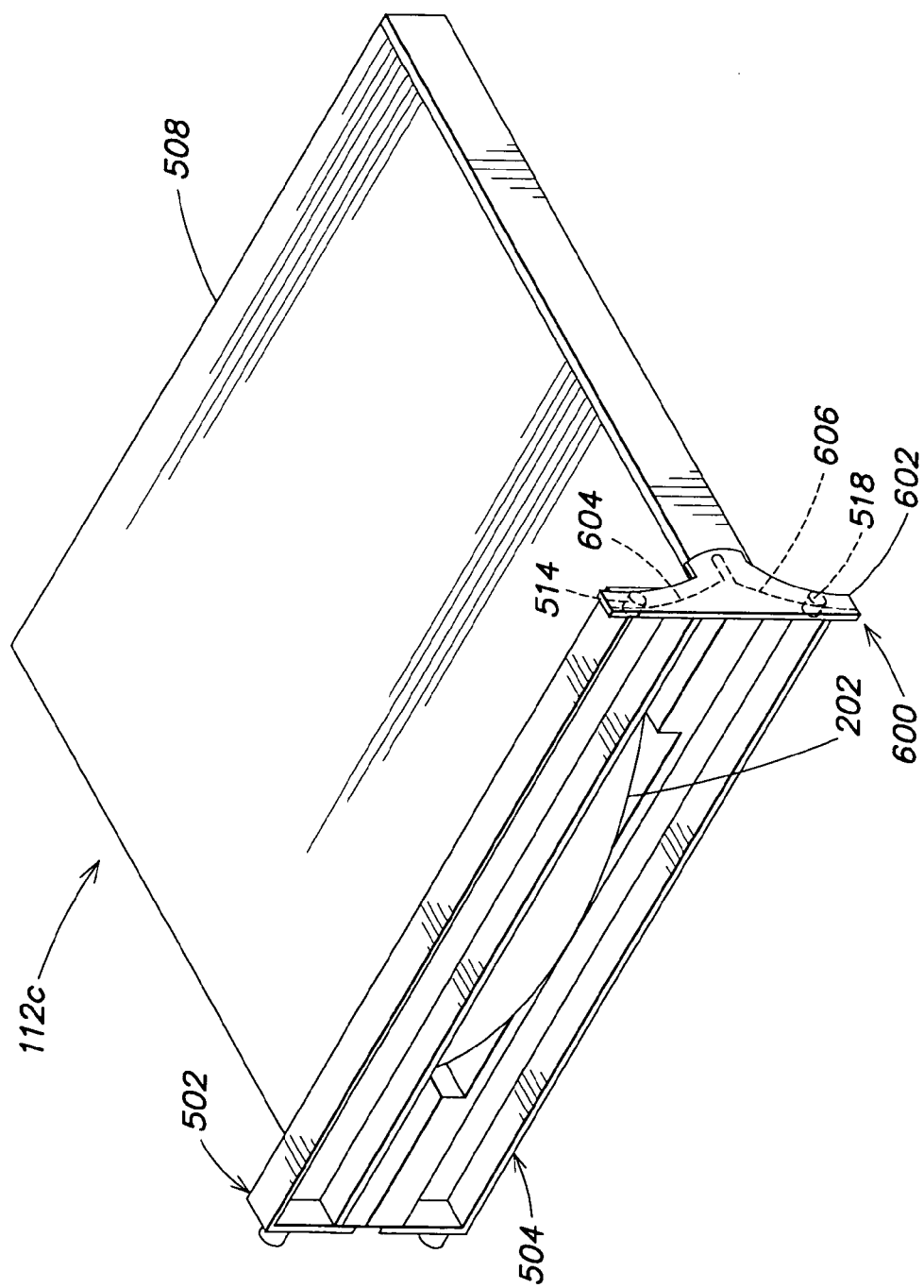
FIG. 6B is a view similar to FIG. 6A, showing the substrate carrier of FIGS. 5A–5D in a open condition.

FIGS. 6A and 6B are isometric views showing the substrate carrier 112c in relation to an actuating mechanism 600 provided in accordance with this embodiment of the invention. The actuator mechanism 600 includes a cam 602 which has upper and lower cam slots 604, 606, for respectively interacting with the cam followers 514, 518 of the upper door 502 and the lower door 504. (The cam slots 604, 606 and the cam follower 514, 518 are shown in phantom in FIGS. 6A, 6B, since an outer wall 607 of the cam 602 obscures the cam slots 604, 606 and the cam followers 514, 518.) As the substrate carrier 112c is moved forward (i.e., in the direction indicated by the arrow 608 in FIG. 6A) the cam follower 514 enters the cam slot 604 and the cam follower 518 enters the cam slot 606. The cam slot 604 guides the cam follower 514 upwardly, thereby upwardly pivoting the upper door 502 of the substrate carrier 112c to open the upper door 502. At the same time, the cam slot 606 guides the cam follower 518 downwardly, thereby pivoting the lower door 504 downwardly to open the lower door 504. Consequently, the open condition shown in FIG. 6B is achieved, so that the substrate 202 contained in the carrier housing 508 is available for extraction from the substrate carrier 112c.

Although a cam 602 is shown in FIGS. 6A and 6B on only one side of the substrate carrier 112c, a cam and follower arrangement may also be provided on the other side of the substrate carrier 112c.

Figure 7A:
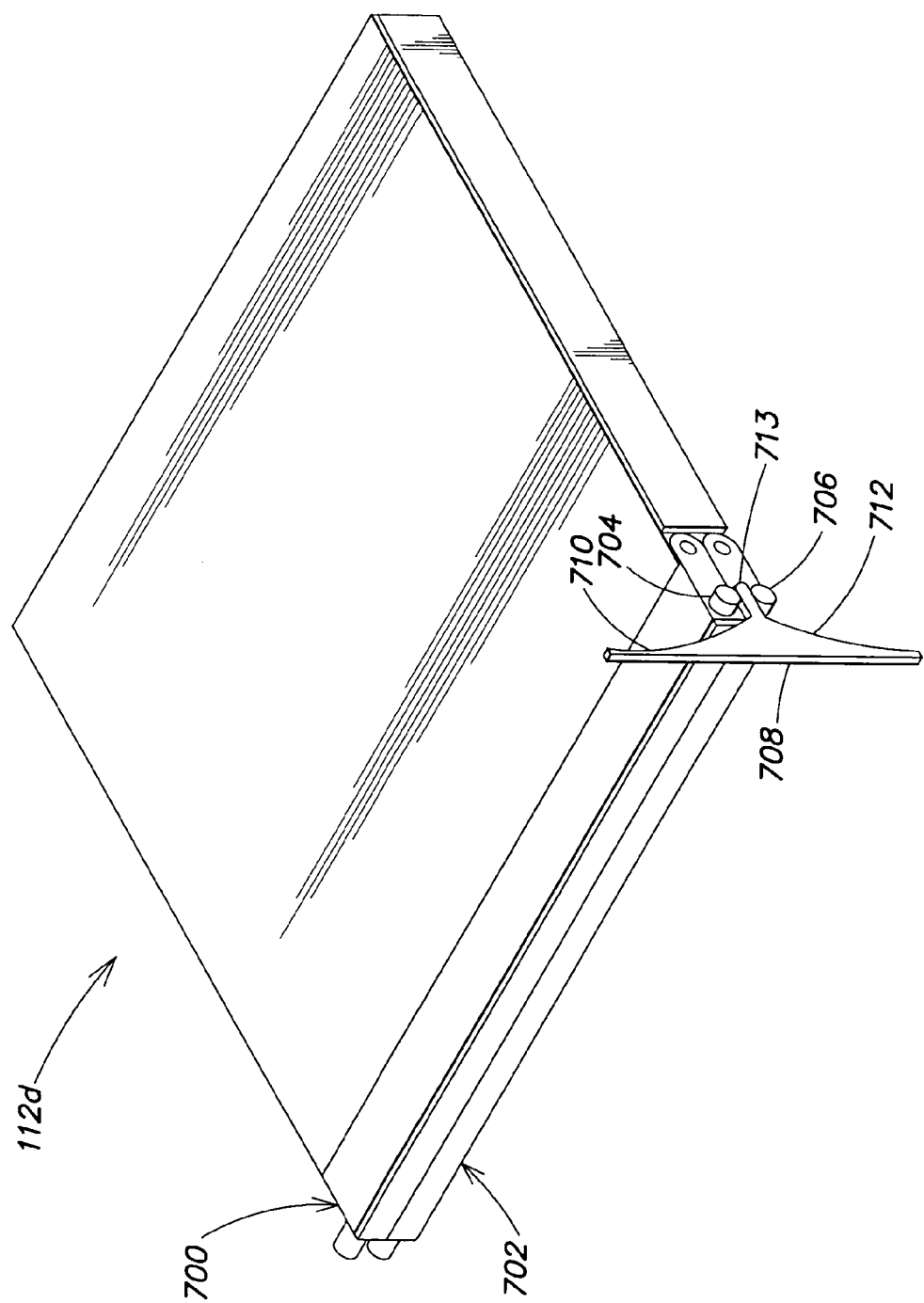
FIG. 7A is an isometric view showing a substrate carrier and carrier opening apparatus provided in accordance with still another embodiment of the invention, with the substrate carrier in a closed condition.
Figure 7B:
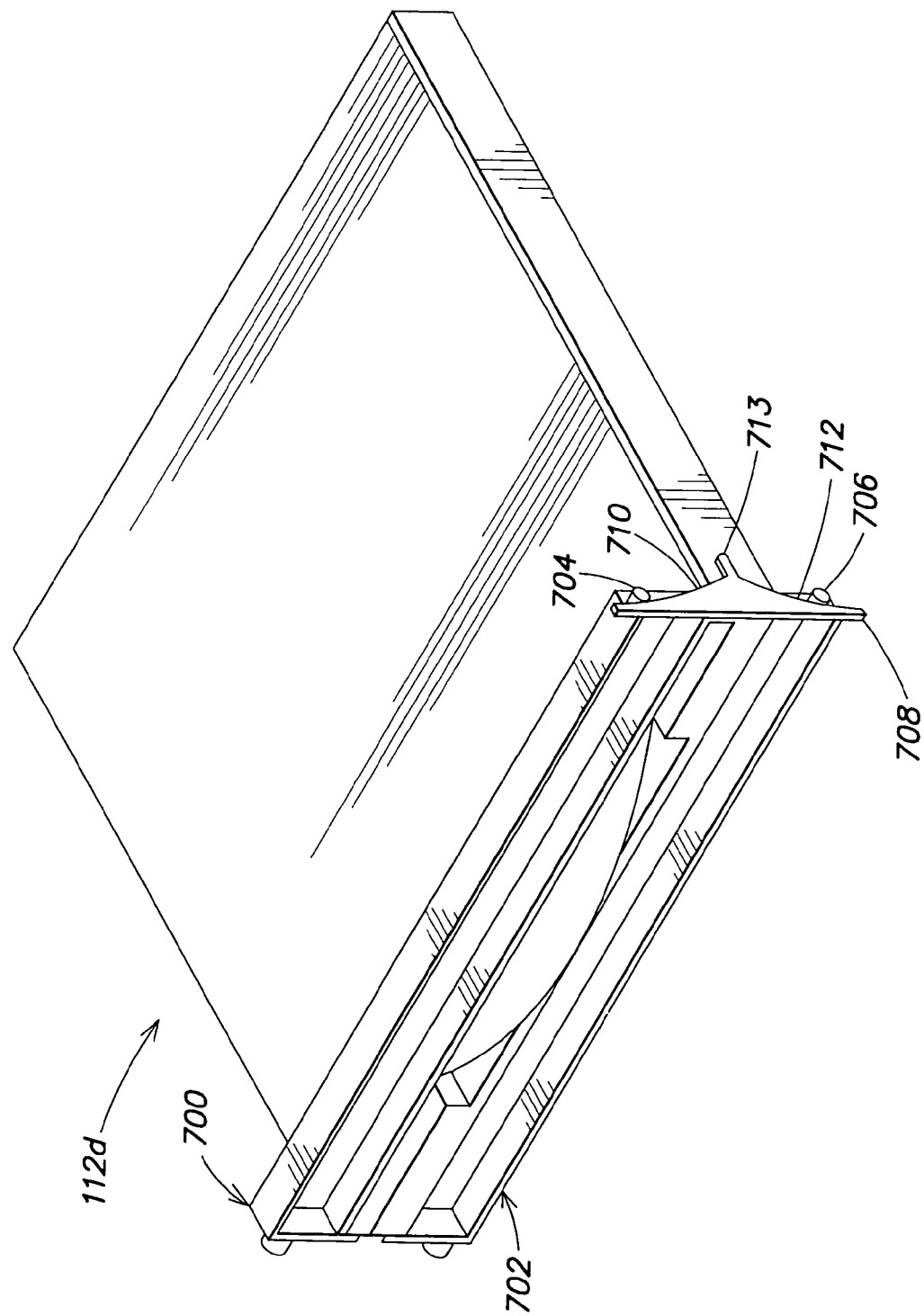
FIG. 7B is a view similar to FIG. 7A, showing the substrate carrier of FIG. 7A in an open condition.

FIGS. 7A and 7B are isometric views of another embodiment of the invention, employing magnetic camming to open upper and lower doors 700, 702 of a substrate carrier 112d. In the embodiment of FIGS. 7A and 7B, cam followers 704, 706 on the doors 700, 702 are magnets. A magnetic cam 708 is provided to interact with the magnetic cam followers 704, 706 to open the doors 700, 702 as the substrate carrier 112d is moved forward. For example, the magnetic cam follower 704 may have a north magnetic pole facing downwardly and the magnetic cam follower 706 may have a south magnetic pole facing upwardly. (By this arrangement, the doors 700, 702 may be held in a closed condition by the cam followers 704, 706 when it is intended that the substrate carrier 112d be in a closed condition.) The magnetic cam 708 may have an upper face 710 that is a magnetic south pole, and a lower face 712 that is a magnetic north pole. As the substrate carrier 112d is moved forward, the magnetic fields of the cam followers 704, 706 and of the magnetic cam 708 cause the doors 700, 702 to open, to achieve the open condition of the substrate carrier 112d illustrated in FIG. 7B.

To achieve initial separation of the upper and lower doors 700, 702, an end 713 of the cam 708 may be positioned so as to be inserted between the cam followers 704, 706 thereof as the substrate carrier 112d is moved forward toward the cam 708. Alternatively the magnetic field of the cam 708 may be stronger than that of the cam followers 704, 706. The shape and relative position of the magnetic cam/follower arrangement may be such that door opening and closing may be achieved with out physical contact between the cam 708 and each follower 704, 706. The magnetic polarities for the cam followers 704, 706 and/or the magnetic cam 708 may be reversed. For example, the magnetic cam follower 704 may have a south magnetic pole facing downward and the magnetic cam follower 706 may have a north magnetic pole facing upward; and/or the upper face 710 of the magnetic cam 708 may be a north magnetic pole and the lower face 712 of the magnetic cam 708 may be a south magnetic pole. Repulsive forces may be used to open the doors 700, 702 (e.g., by employing an upper magnetic face 710 of the magnetic cam 708 having the same magnetic polarity as the cam follower 704, and a lower magnetic face 712 of the magnetic cam 708 having the same magnetic polarity as the cam follower 706).

Figure 8:
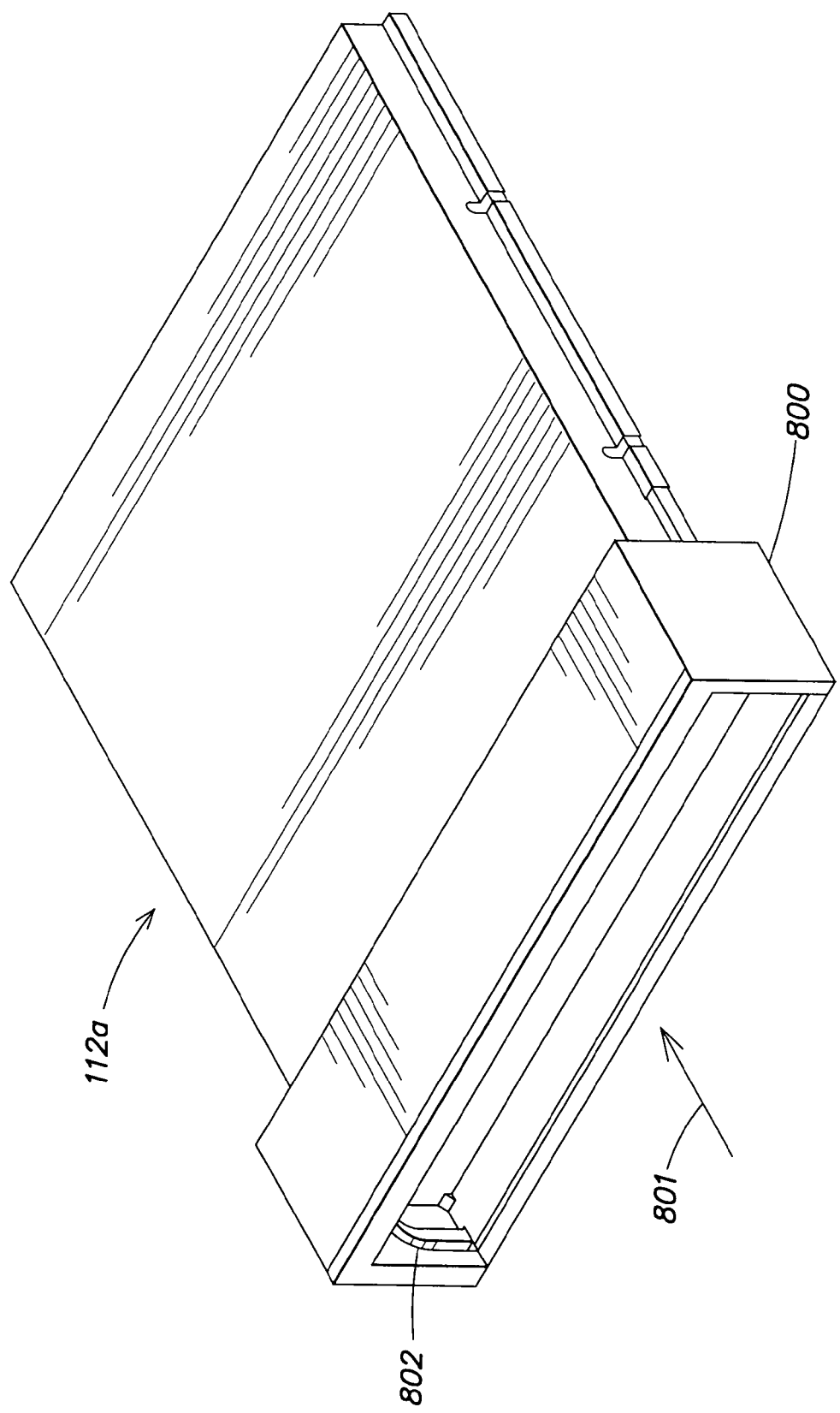
FIG. 8 is an isometric view showing the inventive substrate carrier of FIG. 2A in juxtaposition with a carrier opening apparatus provided in accordance with still another embodiment of the invention.
Figure 9:
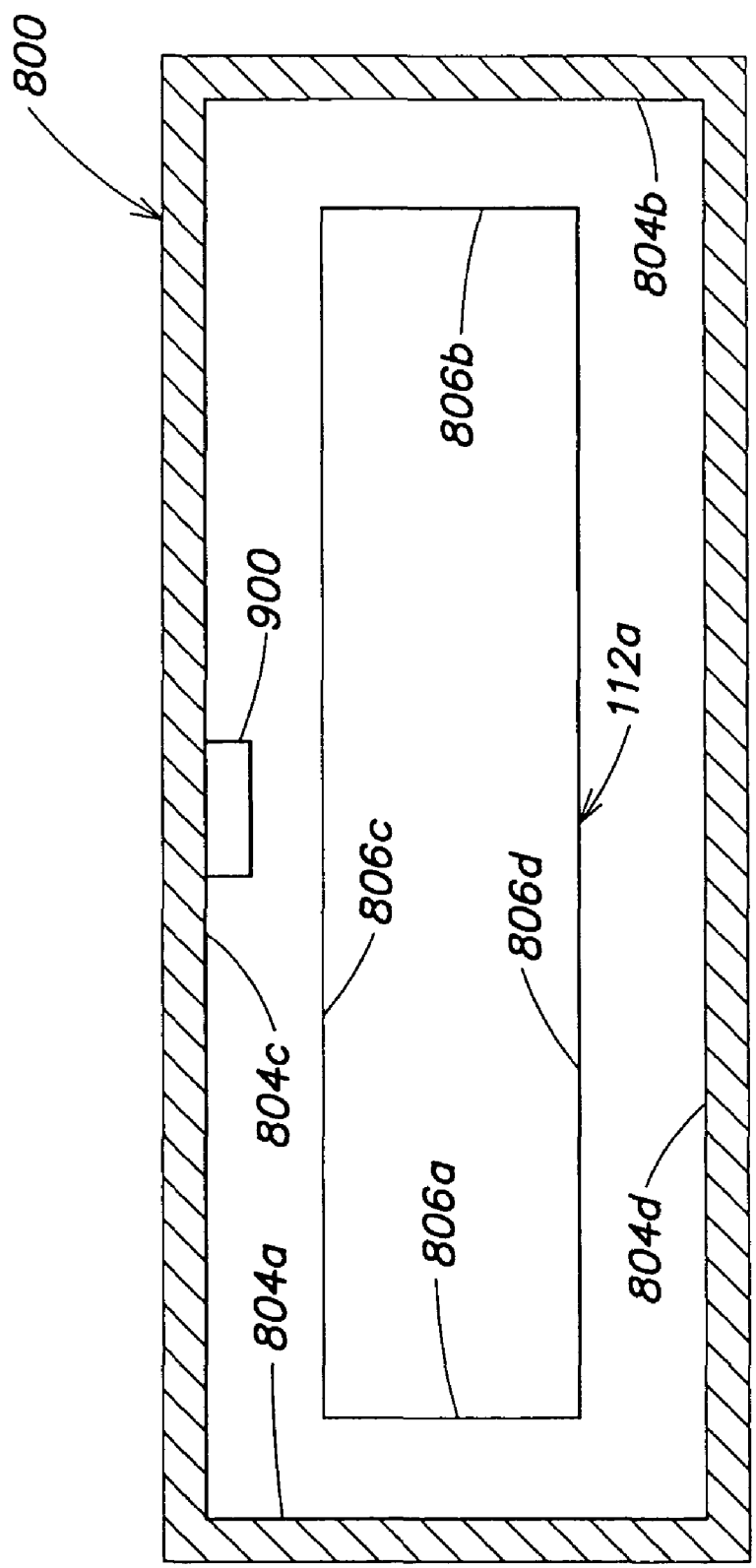
FIG. 9 is a schematic rear elevational view showing the inventive substrate carrier of FIG. 2A in juxtaposition with the carrier opening apparatus of FIG. 8.

Still another embodiment of the invention will now be described with reference to FIGS. 8 and 9. In the embodiment of FIGS. 8 and 9, the same inventive substrate carrier 112a may be used as in the embodiment of FIGS. 2A–3B. However, in this embodiment the port 104 of the factory interface 102 (FIG. 1) may take the form of a tunnel 800 (e.g., a tunnel may be integral with the port or attached thereto), to which the substrate carrier 112a is docked. In this embodiment, the optional door 106 (FIG. 1) is preferably not employed. In accordance with this embodiment of the invention, positive air pressure is maintained in the factory interface 102, such that a flow of air is maintained in the tunnel 800, flowing outwardly from the factory interface 102 (as shown by arrow 801 in FIG. 8). A positive static pressure may be maintained within the factory interface 102 via a flow of filtered air through the factory interface (e.g., from a top of the factory interface to a bottom of the factory interface) and with the use of HEPA, ULPA or similar cleanroom grade filters known in the art. In one embodiment of the invention, a 0.005–0.2 inches of water pressure differential between the inside and outside of the factory interface 102 may be employed (e.g., using recirculated, filtered ambient air).

FIG. 8 is an isometric view showing the substrate carrier 112a in juxtaposition with the tunnel 800. The tunnel 800 may have a cam slot 802 (e.g., similar in structure and function to the cam slot 304 shown in FIG. 3A) to interact with a cam follower (not visible in FIG. 8) of a door of the substrate carrier 112a to open the door (not visible in FIG. 8) of the substrate carrier 112a. A similar configuration may be employed for each of the substrate carriers 112b–112d (e.g., by providing the tunnel 800 with the appropriate number and/or type of cam slots, or with cam followers if the substrate carrier employs cam slots).

FIG. 9 is a rear elevational view showing the substrate carrier 112a juxtaposed with or inserted into the tunnel 800. The tunnel 800 and the factory interface 102 (FIG. 1) are arranged to provide a laminar flow of air through the tunnel 800 and around the substrate carrier 112a. Such a laminar flow may be generated, for example, by providing a space of about 0.05 to 0.150 inches between one or more of sides 804a–b, top 804c and bottom 804d of the tunnel 800 and sides 806a–b, top 806c and bottom 806d of the substrate carrier 112a (or the other inventive substrate carriers described herein) as shown in FIG. 9. Other spacings between the tunnel 800 and a substrate carrier may be employed. The laminar flow of air tends to prevent particles from reaching the locus at which the substrate (not shown in FIG. 9) is withdrawn from the substrate carrier 112a to be transferred to the processing tool 100. Note that such a laminar air flow and/or positive pressure factory interface arrangement may be similarly employed with any substrate carrier (e.g., a single substrate carrier, a multi-substrate carrier, a front opening unified pod, etc.) and with any substrate carrier door arrangement, whether or not substrate carrier movement is employed to open and/or close a substrate carrier door. For example, the present invention may be employed to surround an opening through which substrates are transferred between an open substrate carrier and a processing tool, so as to generate a laminar air flow from the processing tool side past the open substrate carrier.

In the embodiment shown, a sensor 900 is mounted in the tunnel 800 to detect possible disruption of the laminar air flow. For example, the sensor 900 may be a model no. Klixon 2SE, available from Texas Instruments or other suitable sensor. The sensor 900 may be coupled to the controller 118 (FIG. 1) and the controller 118 may operate such that when the sensor 900 detects a disruption in the laminar air flow, the substrate carrier 112a is moved away from the tunnel 800 by the carrier moving mechanism 114. An actuator mechanism (e.g., the cam slot 802 of FIG. 8) translates the undocking movement of the substrate carrier 112a into a force that closes the substrate carrier 112a so that particles do not enter the substrate carrier 112a.

In operation, a substrate carrier 112 (e.g., one of the inventive substrate carriers 112a–112d), containing a substrate to be processed in the processing tool 100, is placed on the support 110 of the substrate transfer location 108 by, for example, a carrier handler robot (not shown). The controller 118 causes the optional door 106 (if any) to be opened, and causes the carrier moving mechanism 114 to dock the substrate carrier 112 with the port 104. The docking movement of the substrate carrier 112 causes an actuator mechanism associated with the substrate transfer location 108 to interact with an opening mechanism of the substrate carrier 112 to open a door (or doors if the substrate carrier is of a type shown in FIGS. 5A–7B) of the substrate carrier 112.

A substrate handling robot (not shown) of the factory interface 102 extracts one or more substrates from the substrate carrier 112 and loads the substrate or substrates into the processing tool 100. The substrate or substrates are processed in the processing tool 100. After the processing of the substrate or substrates is complete, the substrate handling robot returns the substrate or substrates to the substrate carrier 112. The carrier moving mechanism 114 then undocks the substrate carrier 112 from the port 104. The undocking movement of the substrate carrier 112 causes the actuator mechanism of the substrate transfer location 108 to interact with the opening mechanism of the substrate carrier 112 to close the door (or doors if the substrate carrier employs multiple doors as shown in FIGS. 5A–7B) of the substrate carrier. The controller 118 may then cause the optional door 106 for the port 104 to be closed. The substrate carrier 112 may then be removed from the support 110 and moved to another processing tool for further processing or to another location in the fabrication facility.

The apparatus for opening substrate carriers disclosed herein may provide a simple, cost-effective, and efficient arrangement by which substrate carriers may be opened to allow extraction of substrates therefrom.

As used in the appended claims, "docking" means the inward motion of the substrate carrier toward a port through which a substrate is exchanged, such as a port in a clean room wall. Similarly, "undocking" means the outward motion of the substrate carrier away from a port through which substrates are exchanged, such as a port in a clean room wall.

Figure 10:
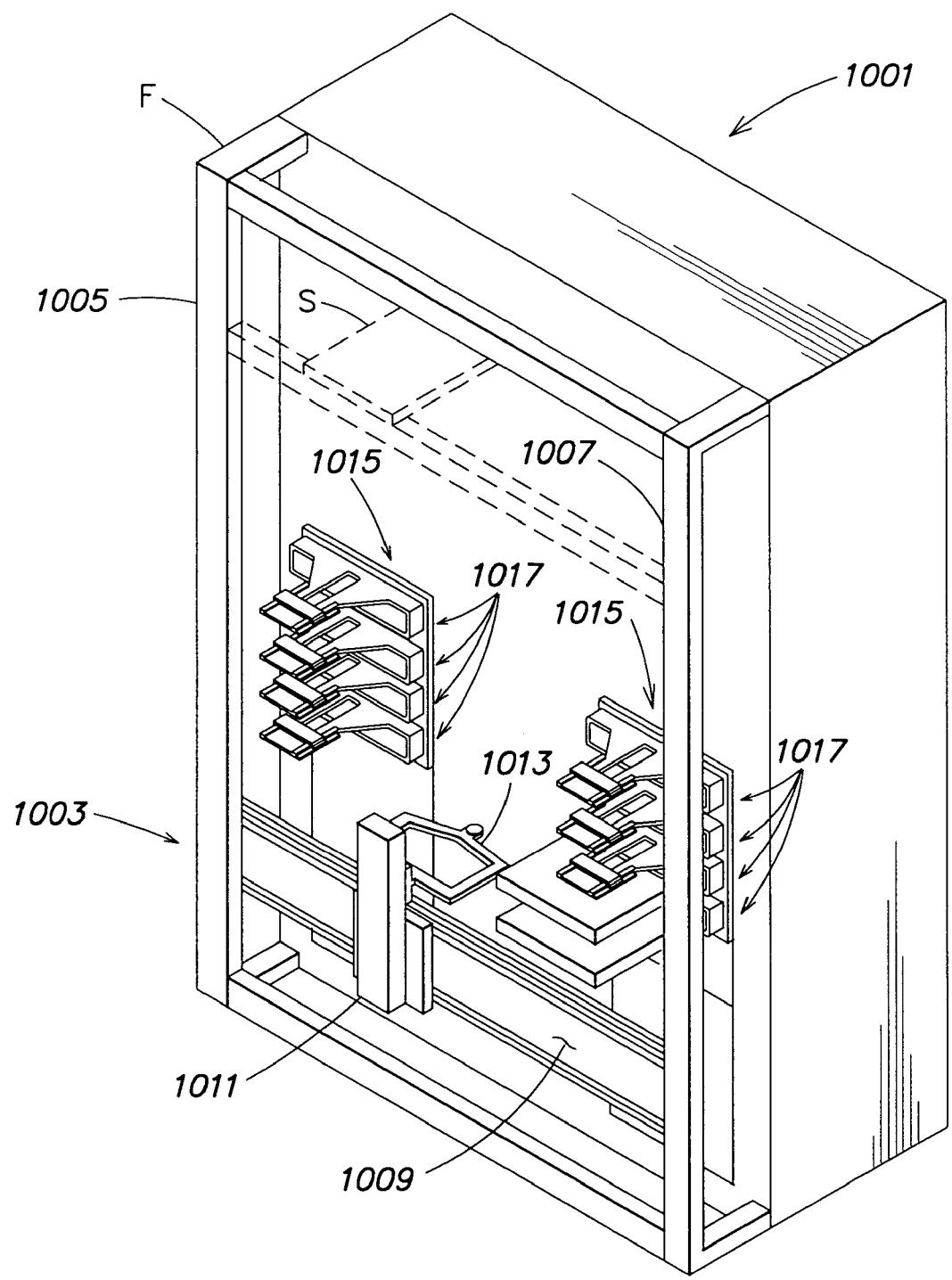
FIG. 10 is an isometric view of an alternative embodiment of a substrate loading station that includes a substrate carrier handler that may be employed with the present invention.

Instead of the support 110 and carrier moving mechanism 114 illustrated herein, the substrate transfer location may have a gripper adapted to grip the substrate carrier (e.g., by a top flange of the substrate carrier) and to move the substrate carrier toward and away from the port 104, as disclosed in previously incorporated U.S. patent application serial No. 60/407,337, filed Aug. 31, 2002, and titled "Wafer Loading Station with Docking Grippers at Docking Stations". For example, FIG. 10 is an isometric view of an alternative embodiment of a substrate loading station that includes a substrate carrier handler that may be employed with the present invention. In FIG. 10, reference numeral 1001 indicates the alternative substrate loading station. Reference numeral 1003 indicates an alternative substrate carrier handler. The substrate loading station 1001 of FIG. 10 may be generally similar to an embodiment of a loading station disclosed in above-referenced co-pending U.S. patent application Ser. No. 60/407,337, filed Aug. 31, 2002, and titled "Wafer Loading Station with Docking Grippers at Docking Stations".

The substrate carrier handler 1003 of FIG. 10 includes a pair of vertical guides 1005, 1007 and a horizontal guide 1009 which is mounted for vertical movement on the vertical guides 1005, 1007. A support 1011 is mounted on the horizontal guide 1009 for horizontal movement along the horizontal guide 1009. An end effector 1013 is mounted on the support 1011. The end effector 1013 may comprise, for example, an end effector capable of changing the orientation of a substrate carrier from vertical to horizontal and vice versa as described in previously incorporated U.S. patent application Ser. No. 60/407,452, filed Aug. 31, 2002 and titled "End Effector Having Mechanism For Reorienting A Wafer Carrier Between Vertical And Horizontal Orientations". Any other suitable end effector also may be employed, such as an end effector which grips a substrate carrier via an overhead transfer flange of the substrate carrier.

It will be observed that the substrate loading station 1001 has two columns of docking stations 1015, although fewer or more columns of docking stations may be employed. Each docking station 1015 includes a plurality of docking grippers 1017. Each docking gripper 1017 is adapted to support a substrate carrier via its overhead transfer flange, and to dock and undock a substrate carrier (as previously described). Alternatively, the docking grippers may be replaced with docking platforms that support a substrate carrier (e.g., via the substrate carrier's bottom surface) and that move toward and away from the cleanroom wall (or front wall of a chamber such as a factory interface chamber) to which the docking platform is mounted.

Preferably, the substrate loading station 1001 comprises a frame F to which the vertical and horizontal guides 1005, 1007 and 1009 are coupled. In this manner, the preferred substrate loading station 1001 is modular and may be quickly installed and calibrated. In the event the substrate loading station 1001 includes one or more storage shelves S (shown in phantom), the storage shelf S also may be mounted on the frame F. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame F as described, for example, in previously incorporated U.S. patent application Ser. No. 60/407,451, filed Aug. 31, 2002 and titled "System For Transporting Wafer Carriers".

In one aspect, the frame F may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism may be mounted. When the frame F, the docking mechanisms, and the substrate carrier opening mechanism are each mounted to predetermined locations on the same surface, the relative positions of each are predetermined, and installation and calibration of the substrate loading station 1001 is facilitated.

Figure 11:
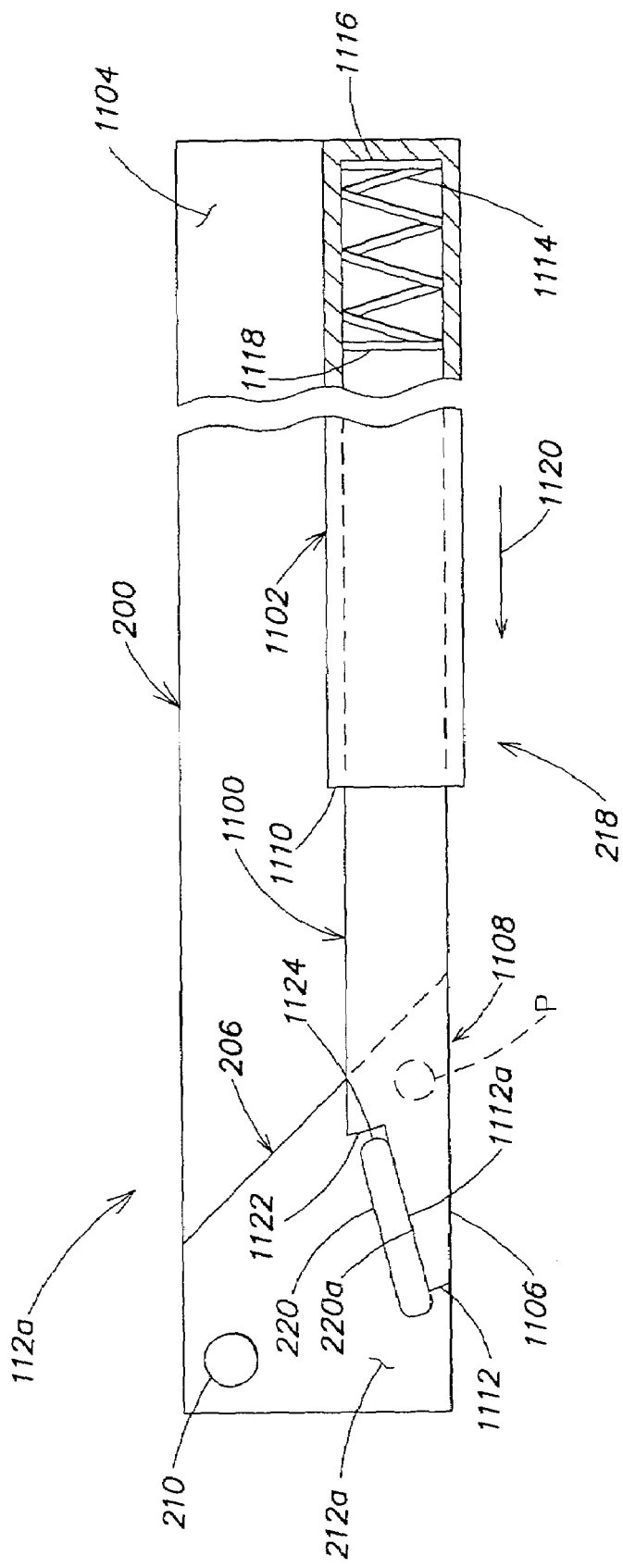
FIG. 11 is a partial side elevational view of the inventive substrate carrier of FIG. 2A, showing details of an exemplary embodiment of the latching mechanism of FIG. 2A.

FIG. 11 is a partial side elevational view of the inventive substrate carrier 112a, showing details of an exemplary embodiment of the latching mechanism 218. The latching mechanism 218 may be configured, for example, as described in previously incorporated U.S. patent application Ser. No. 60/407,340, filed Aug. 31, 2002 and titled "Wafer Carrier having Door Latching and Wafer Clamping Mechanisms". The latching action of the latching mechanism 218 is provided by interaction between the tab 220 which extends outwardly from the side 212a of the door 206 and a latch member 1100 that is slidable within an enclosure 1102 provided on a side 1104 of the carrier housing 200. In the example shown, the tab 220 is positioned above a lower edge 1106 of the door 206. The latch member 1100 has an outer end 1108 that extends outwardly from a mouth 1110 of the enclosure 1102. The latch member 1100 includes a finger 1112 that extends outwardly from the outer end 1108 of the latch member 1100. The finger 1112 is configured so that when the latching mechanism 218 is in its latching condition, as shown in FIG. 11 and as described further below, the door 206 is closed and the finger 1112 of the latch member 1100 underlies the tab 220. In this position, the finger 1112 prevents the tab 220 (and thus the door 206) from pivoting about a pivot point P relative to the carrier housing 200 (e.g., by applying an upward force on the tab 220 to keep the door 206 in a closed position). Specifically, a portion 1112a of the finger 1112 contacts a portion 220a of the tab 220 as shown in FIG. 11. As described in previously incorporated U.S. Patent Application Ser. No. 60/407,340, filed Aug. 31, 2002 and titled "Wafer Carrier having Door Latching and Wafer Clamping Mechanisms", the portion 220a of the tab 220 and/or the portion 1112a of the finger 1112 may be sloped relative to a horizontal plane (e.g., at about 10–15°, although other or no angles may be employed).

The latching mechanism 218 also includes a biasing mechanism such as a spring 1114. The spring 1114 is held in an inner end 1116 of the enclosure 1102 (e.g., the end opposite to the mouth 1110 of the enclosure 1102). The spring 1114 pushes against an inner end 1118 of the latch member 1100 to bias the latch member 1100 outwardly (in the direction indicated by arrow 1120) toward the tab 220 of the door 206 (e.g., toward the latching position illustrated in FIG. 11). Other suitable biasing mechanisms may be similarly employed.

A step 1122 is formed on the outer end 1108 of the latch member 1100 at a point where the finger 1112 emerges from the outer end 1108. When the latching mechanism 218 is in its latching position shown in FIG. 11, the step 1122 of the latch member 1100 abuts a side 1124 of the tab 220 to limit the outward movement of the latch member 1100.

Although only one latching mechanism 218, associated with the side wall 1104 of the carrier housing 200, is shown in the drawing, it will be understood that a second latching mechanism may be provided in association with an opposite side wall of the carrier housing 200 to latch the left side 212b (FIG. 2A) of the door 206. In the multi-door embodiments of the substrate carrier 112 (FIGS. 5A–7B), one or more additional latching mechanisms may be employed to similarly latch the upper door 502. As described further in above-referenced U.S. Patent Application Ser. No. 60/407,340, filed Aug. 31, 2002 and titled "Wafer Carrier having Door Latching and Wafer Clamping Mechanisms", the port 104 (e.g., tunnel 800) may include a stop (not shown) that functions as an actuating mechanism to interact with the latching mechanism 218 of the substrate carrier 112a. (One or more additional port stops may be provided to interact with one or more other latching mechanisms of the substrate carriers 112a–d.) In particular, as a result of a docking movement of the substrate carrier 112a, the finger 1112 of the latch member 1100 comes into contact with the stop. As the substrate carrier 112a continues to move in the opposite direction indicated by the arrow 801 (FIG. 8) during docking, motion of the latch member 1100 in that direction is halted by the stop, causing the latch member 1100 to be pushed into the enclosure 1102 against the biasing force of the spring 1114. As a result, the tab 220 is released from the finger 1112 of the latch member 1100, allowing the door 206 to pivot (about point P) and to be opened by the above-referenced interaction of the cam slot 302 (FIG. 3A) and the cam follower 210 (FIG. 3A and FIG. 11).

FIG. 12A is a schematic isometric view of an exemplary substrate clamping mechanism 1200 that may interact with the latching mechanism 218 of FIG. 11 (as further described in above-referenced U.S. Provisional Patent Application Ser. No. 60/407,340, filed Aug. 31, 2002 and titled "Wafer Carrier having Door Latching and Wafer Clamping Mechanisms"). FIG. 12B is a magnified isometric view, showing details of a portion 1202 of FIG. 12A.

The substrate clamping mechanism 1200 operates by interaction of clamping members 1204 with latch members 1100 of the kind described above in connection with the latching mechanism 218 (FIG. 11). In one embodiment of the invention, as shown in FIG. 12A, four clamping members 1204 are provided, comprising two pairs of clamping members 1204, with each pair of clamping members 1204 associated with a respective latch member 1100. Other numbers of clamping members may be employed.

Referring to FIG. 12B, in one embodiment of the invention each clamping member 1204 is generally L-shaped, having a horizontal leg 1206 and a relatively short vertical leg 1208. Other shapes/configurations may be employed. In FIG. 12B, a side wall of the carrier housing 200 (FIG. 11) is schematically represented by a dashed line 1104. Each clamping member 1204 may be slidably mounted in a respective aperture 1209 (FIG. 2C) of the side wall 1104 of the carrier housing 200.

When the substrate clamping mechanism 1200 is in its clamping condition, as illustrated in FIGS. 12A, 12B, an inner side 1212 of the latch member 1100 contacts the vertical leg 1208 of the clamping member 1204 and holds the clamping member 1204 such that an end 1214 of the horizontal leg 1206 of the clamping member 1204 contacts an edge 1216 of the substrate 202. Simultaneous contact of all four clamping members 1204 with the substrate 202 serves to clamp the substrate 202 (e.g., so as to hold the substrate 202 stationary, particularly during transport of the substrate carrier 112a). The vertical leg 1208 of each clamping member 1204 is biased against the latch member 1100 (e.g., via a spring (not shown) or another suitable biasing mechanism).

Contact with the substrate 202 may be made via a V-shaped groove (not shown) formed in the end 1214 of the horizontal leg 1206 of the clamping member 1204. Other configurations than a V-shaped groove may be employed to contact the substrate 202 (e.g., a flat groove or notch that accommodates the substrate 202, use of a membrane that encapsulates the clamping member 1204 and/or a soft material at the end 1214 of the clamping member 1204 to reduce particle generation and/or substrate contamination, etc.) as described in previously incorporated U.S. Provisional Patent Application Ser. No. 60/407,340, filed Aug. 31, 2002 and titled "Wafer Carrier having Door Latching and Wafer Clamping Mechanisms".

Referring again to FIG. 12B, a notch 1236 is formed in the side 1212 of the latch member 1100. A similar notch, which is not shown, is similarly positioned relative to the other clamping member 1204 associated with the latch member 1100 of FIG. 12B. Moreover, similar notches (not shown) are provided in the other latch member 1100 (FIG. 12A), and are similarly positioned relative to the clamping members 1204 associated with the other latch member 1100.

FIGS. 13A and 13B are views that are respectively similar to FIGS. 12A and 12B, but showing the substrate clamping mechanism 1200 in a released (non-clamping) condition. FIG. 13B is a magnified view showing details of a portion 1300 of FIG. 12A.

With reference to FIGS. 12A and 12B and FIGS. 13A and 13B, releasing of the clamping mechanism 1200 occurs as follows. A docking movement of the substrate carrier 112a is performed relative to the port 104 (FIG. 1). That is, the carrier housing 200 (represented by side wall 1104 in FIGS. 12B and 13B), the latch members 1100, the clamping members 1204 and the substrate 202 are moved together in the direction indicated by arrow 1302 in FIG. 12B. With reference to FIG. 12B, during the docking movement, the finger 1112 of the latch member 1100 comes into contact with a stop of the tunnel 800 (not shown). Accordingly, motion of the latch member 1100 in the direction indicated by the arrow 1302 is halted. The clamping member 1204 advances along the latch member 1100 until it reaches the notch 1236. A biasing arrangement such as a spring or the like (not shown) may be employed to cause the clamping member 1204 to enter the notch 1236 so that the clamping member 1204 moves away from, and out of contact with, the substrate 202. All four of the clamping members 1204 (FIG. 12A) may move substantially simultaneously out of contact with the substrate 202 in a similar manner, thereby releasing the substrate 202 from clamping.

Referring to FIG. 12B, a notch 1236 is formed in the side 1212 of the latch member 1100. When the substrate clamping mechanism 1200 is in its clamping position as shown in FIG. 12B, the notch 1236 is positioned a predefined distance in a forward direction relative to the clamping member 1204 (as described further below). A similar notch, which is not shown, is similarly positioned relative to the other clamping member 1204 associated with the latch member 1100 of FIG. 12B. Moreover, similar notches (not shown) are provided in the other latch member 1100 (FIG. 12A and PIG. 14A), and are similarly positioned relative to the clamping members 1204 associated with the other latch member 1100.

FIGS. 13A and 139 are views that are respectively similar to PIGS. 12A and 128, but showing the substrate clamping mechanism 1200 in a released (non-clamping) condition. FIG. 132 is a magnified view showing details of a portion 1300 of FIG. 13A.

With reference to FIGS. 12A and 129 and FIGS. 13A and 13B, releasing of the clamping mechanism 1200 occurs as follows. A docking movement of the substrate carrier 112 is performed relative to the port 104 (FIG. 1). That is, the carrier housing 200 (represented by side wall 1104 in FIGS. 12B and 13B), the latch members 1100, the clamping members 1204 and the substrate 202 are moved together in the direction indicated by arrow 1302 in FIG. 12B. With reference to FIGS. 11 and 12B, during the docking movement, the finger 1112 of the latch member 1100 comes into contact with a stop (not shown) of a carrier opening mechanism (not shown) . Accordingly, motion of the latch member 1100 in the direction indicated by the arrow 1302 is halted. The clamping member 1204 advances along the latch member 1100 until it reaches the notch 1236. A biasing arrangement such as the spring 1402 of FIGS. 14A and 148 may be employed to cause the clamping member 1204 to enter the notch 1236 50 that the clamping member 1204 moves away from, and out of contact with, the substrate 202. All four of the clamping members 1204 (FIG. 12A) may move substantially simultaneously out of contact with the substrate 202 in a similar manner, thereby releasing the substrate 202 from clamping. (As an alternative to the above-mentioned biasing arrangement, the clamping member 1204, and in particular the vertical leg 1208 thereof, may be coupled to the latch member 1100 by a tongue-in-groove arrangement or other similar arrangement so that the clamping member 1204 is drawn into the notch 1236 and away from the substrate 202.)

FIG. 14A is a cross sectional view of a substrate carrier 112a of FIGS. 1–3B, 8, and 11, or alternately substrate carrier 112b of FIGS. 4, substrate carrier 112c of FIGS. 5A–6B, and/or substrate carrier 112d of FIGS. 7A–72; FIG. 142 is a magnified isometric view showing details of a portion 1404 of FIG. 14A, wherein the clamping members 1204 have a flat groove 1406 in the end 1408 of the horizontal leg 1206. As stated, other configurations may be employed to provide effective clamping of the substrate 202. As further shown in FIGS. 14A and 14B, the vertical leg 1208 of each clamping member 1204 is biased against the latch member 1100 (e.g., via a spring 1402 or another suitable biasing mechanism).

To protect the substrate 202 from damage due to contaminants generated by the latching mechanism 218 and/or due to contact between the substrate 202 and the clamping members 1204 (1) a membrane (e.g., a flexible membrane 1410, such as a diaphragm in FIG. 142) may be employed to isolate the latching mechanism 218 from a clean substrate area 1412 of the substrate carrier 112a in which the substrate 202 is located (as shown in FIGS. 14A and 14B); and/or (2) the end 1408 of each clamping member 1204 may be provided with a "soft face" (not shown) for contacting the substrate 202 (as shown in FIG. 6A). For example, the flexible membrane 1410 may isolate the substrate 202 from all of the moving parts of the latching mechanism 218 that may generate particles (e.g., the latch member 1100, the clamping members 1204, the springs 1402, etc.) . The flexible membrane 1410 and/or the soft face (not shown) may comprise, for example, a urethane, silicone, etc.

FIG. 15A is a cross sectional view similar to FIG. 14A, but with the clamping members 1204 retracted into the notches 1236 of each latch member 1100; FIG. 15B is a magnified isometric view showing details of a portion 1502 of FIG. 15A. As shown in FIGS. 15A–15B, as the substrate carrier 112a moves forward relative to each latch member 1100, the spring 1402 biases each clamping member 1204 against the latch 1100 so that each clamping member 1204 enters its respective notch 1236 by retracting away from the substrate 202 through aperture 1209 (FIG. 2C). The substrate 202 thereafter may be extracted from the substrate carrier 112a.

The foregoing description discloses only exemplary embodiments of the invention; modification of the above disclosed apparatus which fall within the scope of the invention will be readily apparent to those of ordinary skill in the art. For example, although the present invention is illustrated with respect to single substrate carriers, it will be understood that the present invention may be applied to substrate carriers that hold more than one substrate. "Single substrate carrier" will be understood to mean a substrate carrier shaped and sized to contain only one substrate at a time.

Also, if the substrate carrier has only one door (as in the embodiment of FIG. 2A), that door may be arranged to pivot upwardly to open, rather than pivoting downwardly to open. Downward pivoting is preferred, however, based on potential particle contamination considerations.

The present invention has been illustrated in connection with interfacing a substrate carrier to a processing tool via a factory interface chamber. However, the present invention is equally applicable to interfacing a substrate carrier to a metrology location, to a chemical/mechanical polishing (CMP) device, or to any other location or device to which a substrate may be transported in a substrate carrier.

The present invention may be used in conjunction with a processing tool which performs, for example, one or more of deposition, oxidation, nitradization, etching, thermal processing, photolithography, etc. Instead of employing the inventive substrate transfer location adjacent a factory interface, the inventive substrate transfer location may be adjacent a load lock of a processing tool. It will be understood that the factory interface chamber may comprise a portion of the clean room wall. Similarly, in a fabrication facility that does not employ a separate clean room wall for forming a separate clean area, the factory interface chamber itself may be considered the clean room wall.

Rather than employing a cam follower located on a substrate carrier that interacts with a cam slot at a location where the substrate carrier is to be opened, it will be understood that the cam slot may be located on the substrate carrier and the cam follower may be at a location where the substrate carrier is to be opened.

Accordingly, while the present invention has been disclosed in connection with exemplary embodiments thereof, it should be understood that other embodiments may fall within the spirit and scope of the invention, as defined by the following claims.

The invention claimed is:

1. An apparatus for opening a substrate carrier comprising:
   a substrate transfer location having a support adapted to support a substrate carrier and an actuator mechanism positioned relative to the support so as to interact with an opening mechanism of a substrate carrier supported by the support;
   wherein the actuator mechanism is adapted to interface with the opening mechanism of the substrate carrier so as to employ a movement of the substrate carrier to actuate opening of the substrate carrier;
   wherein the support is a docking platform and the actuator mechanism is adapted to interface with the opening mechanism of the substrate carrier so as to employ a docking movement of the substrate carrier to actuate opening of the substrate carrier;
   a sensor adapted to sense a condition indicative of air flow directed so as to flow laminarly past the substrate carrier positioned on the docking platform; and
   a controller coupled to the sensor and the docking platform and adapted to move the docking platform so as to close a substrate carrier supported thereon if the sensor detects loss of the laminar air flow.

2. The apparatus of claim 1, further comprising at least one substrate carrier storage shelf associated with the substrate transfer location.

3. The apparatus of claim 2, wherein the at least one storage shelf is located vertically above the substrate transfer location.

4. The apparatus of claim 1, wherein the substrate transfer location includes a tunnel adapted to direct a laminar air flow past a substrate carrier docked at the substrate transfer location.

5. The apparatus of claim 1, wherein the actuator mechanism is adapted to interface with the opening mechanism of the substrate carrier so as to employ a second movement of the substrate carrier to actuate closing of the substrate carrier.

6. The apparatus of claim 1, wherein the actuator mechanism is adapted to interface with the opening mechanism of the substrate carrier via a cam follower arrangement.

7. The apparatus of claim 6, wherein the actuator mechanism is adapted to interface with the opening mechanism of the substrate carrier via a magnetic cam follower arrangement.

8. The apparatus of claim 1, wherein the actuator mechanism is adapted to interface with the opening mechanism of the substrate carrier to pivot a door of the substrate carrier.

9. The apparatus of claim 8, wherein the actuator mechanism is adapted to interface with the opening mechanism of the substrate carrier to pivot the door downwardly.

10. The apparatus of claim 8, wherein the actuator mechanism is adapted to interface with the opening mechanism of the substrate carrier to pivot a pair of doors of the substrate carrier in opposite directions.

11. The apparatus of claim 1, wherein the actuator mechanism is adapted to unlatch an openable portion of the substrate carrier.

12. The apparatus of claim 11, wherein the actuator mechanism is adapted to unclamp a substrate contained in the substrate carrier.

13. The apparatus of claim 1, wherein the actuator mechanism is adapted to unclamp a substrate contained in the substrate carrier.

14. The apparatus of claim 1, wherein the movement of the substrate carrier employed to actuate opening of the substrate carrier is a movement toward a processing tool associated with the substrate transfer location.

15. The apparatus of claim 1, wherein the substrate transfer location includes a port through which a substrate is transferred.

16. A system for opening a substrate carrier, comprising:
a substrate carrier having an openable portion, and having an opening mechanism coupled to the openable portion;
a substrate transfer location having a support adapted to support the substrate carrier, and an actuator mechanism positioned relative to the support so as to interact with the opening mechanism coupled to the openable portion of the substrate carrier;
wherein the actuator mechanism of the substrate transfer location and the opening mechanism of the substrate carrier are adapted to interface with each other so as to employ movement of the substrate carrier to achieve opening and closing of the substrate carrier;
wherein the support is a docking platform and the actuator mechanism is adapted to interface with the opening mechanism of the substrate carrier so as to employ a docking movement of the substrate carrier to actuate opening of the substrate carrier;
a sensor adapted to sense a condition indicative of air flow directed so as to flow laminarly past a the substrate carrier supported by the docking platform; and
a controller coupled to the sensor and the docking platform and adapted to move the docking platform so as to close a substrate carrier supported thereby if the sensor detects loss of the laminar air flow.

17. The system of claim 16, wherein the substrate transfer location further comprises a port through which substrates may be transferred.

18. The system of claim 16, further comprising at least one substrate carrier storage shelf associated with the substrate transfer location.

19. The system of claim 18, wherein the at least one storage shelf is located vertically above the substrate transfer location.

20. The system of claim 16, wherein the substrate transfer location includes a tunnel adapted to direct a laminar air flow past a substrate carrier positioned at the substrate transfer location.

21. The system of claim 16, wherein the actuator mechanism is adapted to interface with the opening mechanism of the substrate carrier via a cam follower arrangement.

22. The system of claim 21, wherein the actuator mechanism is adapted to interface with the opening mechanism of the substrate carrier via a magnetic cam follower arrangement.

23. The system of claim 16, wherein the actuator mechanism is adapted to interface with the opening mechanism of the substrate carrier to pivot a door of the substrate carrier.

24. The system of claim 23, wherein the actuator mechanism is adapted to interface with the opening mechanism of the substrate carrier to pivot the door downwardly.

25. The system of claim 23, wherein the actuator mechanism is adapted to interface with the opening mechanism of the substrate carrier to pivot a pair of doors of the substrate carrier in opposite directions.

26. The system of claim 16, wherein the actuator mechanism is adapted to employ movement of the substrate carrier to unlatch an openable portion of the substrate carrier.

27. The system of claim 26, wherein the actuator mechanism is adapted to employ movement of the substrate carrier to unclamp a substrate contained in the substrate carrier.

28. The system of claim 16, wherein the actuator mechanism is adapted to employ movement of the substrate carrier to unclamp a substrate contained in the substrate carrier.

29. The system of claim 16, wherein the movement of the substrate carrier employed to actuate opening of the substrate carrier is a movement towards a processing tool associated with the substrate transfer location.

30. The system of claim 16, wherein the substrate transfer location includes a port through which a substrate is transferred.

31. A system for opening a substrate carrier, comprising:
a port adapted to have a substrate transferred there through;
a first mechanism adapted to move a substrate carrier toward the port; and
a second mechanism adapted to translate motion of the substrate carrier toward the port into a force for opening a door of the substrate carrier;
a sensor adapted to sense a condition indicative of air flow directed so as to flow laminarly past the substrate carrier supported by the first mechanism; and
a controller coupled to the sensor and the first mechanism and adapted to move the first mechanism so as to close a substrate carrier supported thereby if the sensor detects loss of the laminar air flow.

32. The system of claim 31, wherein the first mechanism includes a docking platform adapted to move a substrate carrier supported thereon toward the port.

33. The system of claim 31, wherein the second mechanism includes a cam mounted adjacent the port and a cam follower coupled to the door of the substrate carrier.

34. The system of claim 31, wherein the force for opening a door of the substrate carrier comprises a force for pivoting the door on a hinge mounted on the substrate carrier.

35. The system of claim 31, wherein the port is a port formed in a clean room wall.

36. A method of opening a substrate carrier, comprising:
moving a substrate carrier on a docking platform toward a port that is adapted to have a substrate transferred therethrough;
translating motion of the substrate carrier toward the port into a force for opening a door of the substrate carrier;
sensing a condition indicative of air flow directed so as to flow laminarly past a the substrate carrier supported by the docking platform; and
moving the docking platform so as to close a substrate carrier supported thereby if loss of the laminar air flow is sensed.

37. The method of claim 36, wherein the moving step comprises moving the docking platform toward the port.

38. The method of claim 36, wherein the translating step includes contacting a cam follower coupled to the door with a cam mounted adjacent the port.

39. The method of claim 36, wherein the translating step includes exposing a magnet coupled to the door to a magnetic field generated by a magnet mounted adjacent the port.

40. The method of claim 36, wherein the opening of the door includes pivoting the door on a hinge mounted on the substrate carrier.

41. The method of claim 40, wherein the opening of the door includes pivoting the door downwardly.

42. The method of claim 36, wherein the translating step includes translating the motion of the substrate carrier into respective forces for opening two doors of the substrate carrier.

43. A method of opening a substrate carrier, comprising:
moving a substrate carrier using a docking platform;
translating the motion of the substrate carrier into respective forces for opening two doors of the substrate carrier;
sensing a condition indicative of air flow directed so as to flow laminarly past a substrate carrier supported by the docking platform; and
moving the docking platform so as to close a substrate carrier supported thereby if loss of the laminar air flow is sensed.

44. The method of claim 43, wherein the translating step includes contacting with a cam, respective cam followers coupled to the doors.

45. The method of claim 44, wherein the translating step includes exposing to a magnetic field respective magnets coupled to the doors.

* * * * *